US012772663B2

(12) United States Patent
Yamazaki et al.

(10) Patent No.: US 12,772,663 B2
(45) Date of Patent: Oct. 20, 2026

(54) MANUFACTURING METHOD OF MULTILAYER DISPLAY DEVICE

(71) Applicant: Semiconductor Energy Laboratory Co., Ltd., Kanagawa-ken (JP)

(72) Inventors: Shunpei Yamazaki, Setagaya (JP); Ryota Hodo, Atsugi (JP); Yasuhiro Jinbo, Isehara (JP); Chisato Kato, Isehara (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 714 days.

(21) Appl. No.: 17/856,383

(22) Filed: Jul. 1, 2022

(65) Prior Publication Data

US 2023/0009750 A1 Jan. 12, 2023

(30) Foreign Application Priority Data

Jul. 8, 2021 (JP) ................................. 2021-113468

(51) Int. Cl.
*H10K 59/122* (2023.01)
*H10K 59/35* (2023.01)
(Continued)

(52) U.S. Cl.
CPC ......... *H10K 59/122* (2023.02); *H10K 59/353* (2023.02); *H10K 71/40* (2023.02)

(58) Field of Classification Search
CPC ............................. H10K 59/353; H10K 71/00
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

JP 2000-036385 A 2/2000
JP 2002-324673 A 11/2002
(Continued)

OTHER PUBLICATIONS

Lamprecht, B. et al., "Organic Optoelectronic Device Fabrication Using Standard UV Photolithography," Physica Status Solidi. Rapid Research Letters, Oct. 30, 2007, vol. 2, No. 1, pp. 16-18.
(Continued)

*Primary Examiner* — Duy T Nguyen
*Assistant Examiner* — Kenneth Mark Sipling
(74) *Attorney, Agent, or Firm* — Husch Blackwell LLP

(57) ABSTRACT

To provide a method of manufacturing a display device capable of high resolution. A first EL layer, a first layer, and a second layer are formed over a first pixel electrode; a second EL layer, a third layer, and a fourth layer are formed over the second pixel electrode; a resin layer covering an end portion of the second layer and an end portion of the fourth layer is formed by applying a photosensitive resin, exposing the photosensitive resin to light, and developing the photosensitive resin; a top surface of the first EL layer and a top surface of the second EL layer are exposed by etching parts of the first layer, the second layer, the third layer, and the fourth layer which are not covered with the resin layer; and a common electrode covering the first EL layer, the second EL layer, and the resin layer are formed.

8 Claims, 23 Drawing Sheets

(51) Int. Cl.
*H10K 71/40* (2023.01)
*H10K 71/00* (2023.01)

(58) Field of Classification Search
USPC ........................................................ 438/28
See application file for complete search history.

(56) References Cited

U.S. PATENT DOCUMENTS

| | | | | |
|---|---|---|---|---|
| 7,399,991 | B2 | 7/2008 | Seo et al. | |
| 7,663,149 | B2 | 2/2010 | Seo et al. | |
| 11,678,550 | B2 | 6/2023 | Kato | |
| 12,096,671 | B2 | 9/2024 | Kato | |
| 2002/0072139 | A1 | 6/2002 | Kashiwabara | |
| 2004/0144754 | A1* | 7/2004 | Itami | G02F 1/133553 216/62 |
| 2006/0156546 | A1* | 7/2006 | Yokouchi | B41J 2/162 29/890.142 |
| 2011/0148290 | A1 | 6/2011 | Oota | |
| 2012/0252151 | A1* | 10/2012 | Kimura | H10K 71/00 438/34 |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1* | 4/2013 | Yoshitoku | H10K 59/35 257/E51.026 |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0103649 | A1* | 4/2016 | Yoshitani | G06F 3/1446 345/694 |
| 2016/0104760 | A1* | 4/2016 | Maeda | H10K 59/80522 438/34 |
| 2016/0172595 | A1 | 6/2016 | Malinowski et al. | |
| 2016/0315133 | A1 | 10/2016 | Sato | |
| 2017/0141167 | A1* | 5/2017 | Naganuma | H10K 59/131 |
| 2017/0256754 | A1 | 9/2017 | Defranco et al. | |
| 2018/0190908 | A1 | 7/2018 | Ke et al. | |
| 2020/0203662 | A1 | 6/2020 | Mollard et al. | |
| 2022/0181572 | A1 | 6/2022 | Ohsawa et al. | |
| 2024/0334796 | A1 | 10/2024 | Yamazaki et al. | |
| 2025/0008802 | A1 | 1/2025 | Kato | |

FOREIGN PATENT DOCUMENTS

| | | | |
|---|---|---|---|
| JP | 2003-059663 | A | 2/2003 |
| JP | 2008-098106 | A | 4/2008 |
| JP | 2008-147072 | A | 6/2008 |
| JP | 2008-251270 | A | 10/2008 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2019-179696 | A | 10/2019 |
| JP | 2020-160305 | A | 10/2020 |
| WO | WO-2020/004086 | | 1/2020 |

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

Q

9101

9102

9103

9200

9201

9201

9201

MANUFACTURING METHOD OF MULTILAYER DISPLAY DEVICE

BACKGROUND OF THE INVENTION

1. Field of the Invention

One embodiment of the present invention relates to a display device. One embodiment of the present invention relates to a manufacturing method of a display device.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device generally means a device that can function by utilizing semiconductor characteristics.

2. Description of the Related Art

In recent years, higher resolution has been required for display panels. Examples of devices that require high-resolution display panels include a smartphone, a tablet terminal, and a laptop computer. Furthermore, higher resolution has been required for a stationary display device such as a television device or a monitor device along with an increase in definition. A device absolutely required to have a high-resolution display panel is a device for virtual reality (VR) or augmented reality (AR).

Examples of the display device that can be used for a display panel include, typically, a liquid crystal display device, a light-emitting apparatus including a light-emitting element such as an organic electroluminescent (EL) element or a light-emitting diode (LED), and electronic paper performing display by an electrophoretic method or the like.

An organic EL element generally has a structure in which, for example, a layer containing a light-emitting organic compound is provided between a pair of electrodes. By voltage application to this element, the light-emitting organic compound can emit light. A display device including such an organic EL element needs no backlight which is necessary for a liquid crystal display device and the like and thus can have advantages such as thinness, lightweight, high contrast, and low power consumption. Patent Document 1, for example, discloses an example of a display device using an organic EL element.

Organic EL elements are sometimes used in display portions of display devices for augmented reality (AR) or virtual reality (VR) or display portions of head mounted displays (HMDs). Non-Patent Document 1 discloses a method of manufacturing an organic optoelectronic device using standard UV photolithography.

REFERENCE

Patent Document

[Patent Document 1] Japanese Published Patent Application No. 2002-324673

Non-Patent Document

[Non-Patent Document 1] B. Lamprecht et al., "Organic optoelectronic device fabrication using standard UV photolithography" phys. stat. sol. (RRL) 2, No. 1, p. 16-18 (2008)

SUMMARY OF THE INVENTION

An object of one embodiment of the present invention is to provide a method for easily manufacturing a high-resolution display device. An object of one embodiment of the present invention is to provide a display device having both high display quality and high resolution. An object of one embodiment of the present invention is to provide a display device with high contrast. An object of one embodiment of the present invention is to provide a display device having a high aperture ratio. An object of one embodiment of the present invention is to provide a highly reliable display device.

An object of one embodiment of the present invention is to provide a display device with a novel structure or a method for manufacturing the display device. An object of one embodiment of the present invention is to provide a method for manufacturing the above display device with high yield. An object of one embodiment of the present invention is to reduce at least one of problems of the conventional technique.

Note that the description of these objects does not preclude the existence of other objects. In one embodiment of the present invention, there is no need to achieve all the objects. Objects other than these can be derived from the description of the specification, the drawings, the claims, and the like.

One embodiment of the present invention is a method of manufacturing a display device, including: a first step of forming a first pixel electrode and a second pixel electrode which are apart from each other; a second step of forming a first EL layer, a first layer, and a second layer over the first pixel electrode; a third step of forming a second EL layer, a third layer, and a fourth layer over the second pixel electrode; a fourth step of forming a resin layer covering an end portion of the second layer and an end portion of the fourth layer by applying a photosensitive resin, exposing the photosensitive resin to light, and developing the photosensitive resin; a fifth step of exposing a top surface of the first EL layer and a top surface of the second EL layer by etching parts of the first layer, the second layer, the third layer, and the fourth layer which are not covered with the resin layer; and a sixth step of forming a common electrode covering the first EL layer, the second EL layer, and the resin layer. In the fourth step, first light containing ultraviolet light is used for the light exposure. The second layer and the fourth layer contain a material which reflects or absorbs the first light.

The above method preferably includes a seventh step of changing the resin layer in shape by heat treatment between the fourth step and the fifth step.

The above method preferably includes an eighth step of emitting second light containing ultraviolet light between the fourth step and the seventh step.

Any of the above methods preferably includes a ninth step of forming an insulating film covering the first layer, the second layer, the third layer, and the fourth layer between the third step and the fourth step.

In any of the above methods, part of the insulating film which is not covered with the resin layer is preferably removed in the fifth step.

The above method preferably further includes a tenth step of etching parts or the whole of portions of the insulating film, the second layer, and the fourth layer which are not covered with the resin layer between the ninth step and the fifth step, and an eleventh step of recessing the resin layer by etching part of a surface of the resin layer between the tenth step and the fifth step.

In any of the above methods, each of the second layer and the fourth layer preferably contains silicon. Alternatively, each of the second layer and the fourth layer preferably contains at least one of titanium, chromium, tantalum, carbon, and germanium.

In any of the above methods, each of the first layer and the third layer preferably contains an element different from an element contained in the second layer and the fourth layer. Furthermore, each of the first layer and the third layer preferably contains aluminum oxide.

In any of the above methods, in the fifth step, parts or the whole of the first layer and the third layer are preferably etched by a wet etching method to expose the top surface of the first EL layer and the top surface of the second EL layer.

Another embodiment of the present invention is a display device including a first pixel electrode, a second pixel electrode, a first organic layer, a second organic layer, a common electrode, a first layer, a second layer, a third layer, a fourth layer, and a resin layer. The first organic layer is provided over the first pixel electrode, the second organic layer is provided over the second pixel electrode, and the resin layer includes a portion positioned between the first pixel electrode and the second pixel electrode in a plan view. The common electrode includes a portion overlapping with the first pixel electrode with the first organic layer positioned therebetween, a portion overlapping with the second pixel electrode with the second organic layer positioned therebetween, and a portion overlapping with the resin layer. A side surface of the first organic layer and a side surface of the second organic layer face each other with the resin layer positioned therebetween. The resin layer includes a portion covering a top surface of the first organic layer. The first layer is positioned between the top surface of the first organic layer and the resin layer. The second layer is positioned between the first layer and the resin layer. The third layer is positioned between a top surface of the second organic layer and the resin layer. The fourth layer is positioned between the third layer and the resin layer. The second layer and the fourth layer have a light-blocking property with respect to ultraviolet light.

In the above display device, each of the second layer and the fourth layer preferably contains silicon. Alternatively, each of the second layer and the fourth layer preferably contains at least one of titanium, chromium, tantalum, carbon, and germanium.

In any of the above display devices, each of the first layer and the third layer preferably contains an element different from an element contained in the second layer and the fourth layer. Furthermore, each of the first layer and the third layer preferably contains aluminum oxide.

According to one embodiment of the present invention, a method for easily manufacturing a high-resolution display device can be provided. A display device having both high display quality and high resolution can be provided. A display device with high contrast can be provided. A display device having a high aperture ratio can be provided. A highly reliable display device can be provided.

According to one embodiment of the present invention, a display device with a novel structure or a method for manufacturing the display device can be provided. A method for manufacturing the above display device with high yield can be provided. According to one embodiment of the present invention, at least one of problems of the conventional technique can be reduced.

Note that the description of these effects does not preclude the existence of other effects. One embodiment of the present invention does not necessarily have all the effects. Effects other than these can be derived from the description of the specification, the drawings, the claims, and the like.

DETAILED DESCRIPTION OF THE INVENTION

Figure 1A:
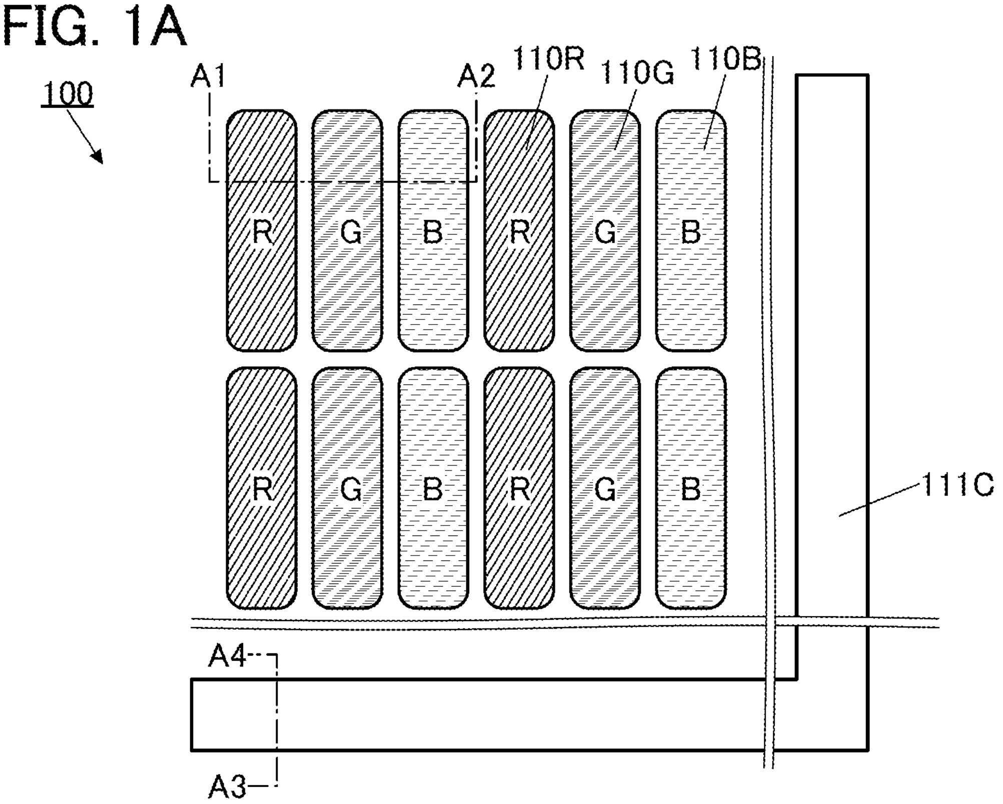
FIGS. 1A to 1C illustrate a structure example of a display device.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Note that in structures of the invention described below, the same portions or portions having similar functions are denoted by the same reference numerals in different drawings, and the description thereof is not repeated. The same hatching pattern is used for portions having similar functions, and the portions are not denoted by specific reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first" and "second" are used in order to avoid confusion among components and do not limit the number of components.

In this specification and the like, the terms "film" and "layer" can be interchanged with each other. For example, in some cases, the terms "conductive layer" and "insulating layer" can be changed into "conductive film" and "insulating film", respectively.

In this specification and the like, a device formed using a metal mask or a fine metal mask (FMM) is sometimes referred to as a device having a metal mask (MM) structure. In this specification and the like, a device formed without using a metal mask or an FMM is sometimes referred to as a device having a metal maskless (MML) structure.

Embodiment 1

In this embodiment, structure examples of a display device of one embodiment of the present invention and manufacturing method examples of the display device will be described.

One embodiment of the present invention is a display device including a light-emitting element (also referred to as a light-emitting device). The display device includes at least two light-emitting elements that emit light of different colors. The light-emitting elements each include a pair of electrodes and an EL layer therebetween. The light-emitting element is preferably an organic electroluminescent element (organic EL element). The two or more light-emitting elements emitting light of different colors include respective EL layers containing different light-emitting materials. For example, three kinds of light-emitting elements emitting red (R), green (G), and blue (B) light are included, whereby a full-color display device can be obtained.

In the case of manufacturing a display device including a plurality of light-emitting elements emitting light of different colors, at least layers (light-emitting layers) containing light-emitting materials different in emission color each need to be formed in an island shape. In a known method for separately forming part or the whole of an EL layer, an island-shaped organic film is formed by an evaporation method using a shadow mask such as a metal mask. However, this method has difficulty in achieving high resolution and a high aperture ratio of a display device because in this method, a deviation from the designed shape and position of the island-shaped organic film is caused by various influences such as the low accuracy of the metal mask position, the positional deviation between the metal mask and a substrate, a warp of the metal mask, and the vapor-scattering-induced expansion of the outline of the formed film. In addition, the outline of a layer may blur during vapor deposition, whereby the thickness of its end portion may be small. That is, the thickness of an island-shaped light-emitting layer may vary from area to area. In the case of manufacturing a display device with a large size, high definition, or high resolution, the manufacturing yield might be reduced because of low dimensional accuracy of the metal mask and deformation due to heat or the like. Thus, a measure has been taken for pseudo improvement in resolution (also referred to pixel density). As a specific measure, a unique pixel arrangement such as a PenTile pattern has been employed.

Note that in this specification and the like, the term "island shape" refers to a state where two or more layers formed using the same material in the same step are physically separated from each other. For example, "island-shaped light-emitting layer" means a state where the light-emitting layer and its adjacent light-emitting layer are physically separated from each other.

In one embodiment of the present invention, fine patterning of an EL layer is performed by photolithography without a shadow mask such as a fine metal mask (FMM). With the patterning, a high-resolution display device with a high aperture ratio, which has been difficult to achieve, can be fabricated. Moreover, EL layers can be formed separately, enabling the display device to perform extremely clear display with high contrast and high display quality. Note that, fine patterning of an EL layer may be performed using both a metal mask and photolithography, for example.

Part or the whole of the EL layer can be physically partitioned, inhibiting a leakage current flowing between adjacent light-emitting elements through a layer (also referred to as a common layer) shared by the light-emitting elements. This can prevent crosstalk due to unintended light emission, so that a display device with extremely high contrast can be obtained. Specifically, a display device having high current efficiency at low luminance can be obtained.

Note that a display device of one embodiment of the present invention can also be obtained by combining white-light-emitting elements with a color filter. In that case, the light-emitting elements having the same structure can be provided in pixels (subpixels) emitting light of different colors, allowing all the layers to be common layers. Furthermore, part or the whole of the EL layer is partitioned by photolithography, which inhibits a leakage current from flowing through the common layers to achieve a display device with high contrast. In particular, when an element has a tandem structure in which a plurality of light-emitting layers are stacked with a highly conductive intermediate layer therebetween, a leakage current through the intermediate layer can be effectively prevented, achieving a display device with high luminance, high resolution, and high contrast.

In the case where the EL layer is processed into an island shape, when a resist mask is formed directly on the EL layer, a solvent or the like of a resin material to be the resist mask might dissolve part or the whole of the EL layer. Thus, in one embodiment of the present invention, a mask layer (sacrificial layer) is formed between the EL layer and the resist mask, preventing damage at the formation of the resist mask. That is, the mask layer (sacrificial layer) functions as a layer protecting the EL layer in the steps of processing the EL layer. After the process of manufacturing the display device is completed, part of the mask layer remains in some cases.

The mask layer is preferably formed using a material soluble in a solvent that is unlikely to dissolve the EL layer (also referred to as a solution or an etchant) and insoluble or poorly soluble in a solvent of the resin material to be the resist mask. In that case, after the EL layer is processed into an island shape, the mask layer can be removed without causing damage to the EL layer. In particular, the mask layer in contact with the EL layer is preferably removed by a wet etching method that gives less damage to the EL layer.

Furthermore, an insulating layer covering at least a side surface of the island-shaped light-emitting layer is preferably provided. The insulating layer may cover part of a top surface of the island-shaped EL layer. For the insulating layer, a material having a barrier property against water and oxygen is preferably used. For example, an inorganic insulating film that is less likely to diffuse water and oxygen can be used. Thus, the deterioration of the EL layer is inhibited, and a highly reliable display device can be achieved.

Between two light-emitting elements that are adjacent to each other, there is a region (depression) where the EL layers of the light-emitting elements are not provided. In the case where the depression is covered with a common electrode or with a common electrode and a common layer, the common electrode might be disconnected (or "step-cut") by a step at an end portion of the EL layer, thereby causing insulation of the common electrode over the EL layer. In view of this, the local gap between the two adjacent light-emitting elements is preferably filled with a resin layer (also referred to as local filling planarization, or LFP) serving as a planarization film. The resin layer has a function of a planarization film. This structure can inhibit a step-cut of the common layer or the common electrode, making it possible to obtain a highly reliable display device.

In the case where the above resin layer is provided in contact with the EL layer, the EL layer might be dissolved by a solvent or the like used in formation of the resin layer. Thus, it is preferable that an insulating layer for protecting the side surface of the EL layer be provided between the EL layer and the resin layer. Specifically, it is preferable that the inorganic insulating layer be provided in contact with a side surface and a top surface of an end portion of the EL layer, and the resin layer be provided over the inorganic insulating layer.

Here, a photosensitive resin material can be used for the resin layer. A pattern of the resin layer can be formed in such a manner that a photosensitive resin is applied and exposed to light through a photomask, and development is performed. Furthermore, light irradiation is performed before the resin is cured, in which case a material capable of being thermally cured at a low temperature can be used. Light (in particular, ultraviolet light) is utilized in some cases for the formation of the resin layer in this manner; however, the EL layer contains an organic substance and thus deteriorates in some cases when receiving ultraviolet light. In view of this, a light-blocking layer that blocks ultraviolet light is formed over the mask layer covering the EL layer, and the resin layer is formed in the state where the EL layer is covered with the light-blocking layer. This can suppress an influence of ultraviolet light during the formation of the resin layer, so that a highly reliable display device can be achieved. Since such a light-blocking layer protects the EL layer in the process of manufacturing a display device, the light-blocking layer can also be referred to as a mask layer (sacrificial layer). Note that in this specification and the like, ultraviolet light refers to light in a wavelength region greater than or equal to 10 nm and less than 400 nm, and visible light refers to light in a wavelength region greater than or equal to 400 nm and less than 700 nm.

As the light-blocking layer formed to overlap with the mask layer, a film containing a material having a light-blocking property, particularly with respect to ultraviolet light, can be used. For example, a film having an ultraviolet light-reflecting property or a film absorbing ultraviolet light can be used. Although a variety of materials, such as a metal having an ultraviolet light-blocking property, an insulator, a semiconductor, or a metalloid, can be used for the light-blocking layer, a film capable of being processed by etching is preferable, and a film having good processability is particularly preferable because part or the whole of the light-blocking layer positioned over the EL layer is removed after the formation of the resin layer.

For example, a semiconductor material such as silicon or germanium can be used as a material with an affinity for the semiconductor manufacturing process. Alternatively, oxide or nitride of the semiconductor material can be used. Alternatively, a non-metallic metal material, such as carbon, a metalloid material, or a compound thereof can be used. Alternatively, a metal, such as titanium, tantalum, tungsten, chromium, or aluminum, or an alloy containing one or more of these metals can be used. Alternatively, oxide containing the above-described metal, such as titanium oxide or chromium oxide, or nitride, such as titanium nitride, nitride chromium, or tantalum nitride, can be used.

The island-shaped EL layer in one embodiment of the present invention is formed by etching, not with a metal mask. Accordingly, a high-resolution display device or a display device with a high aperture ratio, each of which has been difficult to achieve, can be obtained. Moreover, EL layers can be formed separately for the respective colors, enabling the display device to perform extremely clear display with high contrast and high display quality. Moreover, providing the mask layer over the EL layer can reduce damage to the EL layer in the manufacturing process of the display device, resulting in an increase in reliability of the light-emitting device.

The interval between adjacent light-emitting devices can be reduced to less than 10 μm, less than or equal to 5 μm, less than or equal to 3 μm, less than or equal to 2 μm, or less than or equal to 1 μm by the above-described method, whereas it is difficult to reduce the interval to less than 10 μm by a formation method using a metal mask, for example. With the use of a light exposure tool for LSI, the interval between the adjacent light-emitting devices can be reduced to less than or equal to 500 nm, less than or equal to 200 nm, less than or equal to 100 nm, or even less than or equal to 50 nm, for example. Accordingly, the area of a non-light-emitting region that may exist between two light-emitting devices can be significantly reduced, and the aperture ratio can be close to 100%. For example, an aperture ratio higher than or equal to 50%, higher than or equal to 60%, higher than or equal to 70%, higher than or equal to 80%, or higher than or equal to 90% and lower than 100% can be achieved.

Furthermore, the size of the EL layer itself can be made much smaller than that in the case of using an FMM. For example, in the case where EL layers are separately formed using an FMM, the thickness differs between the center and the edge of an island-shaped EL layer, reducing an effective area that can be used as a light-emitting region with respect to the whole area of the EL layer. By contrast, in the above manufacturing method, a film deposited to have a uniform thickness is processed to form an island-shaped EL layer with a uniform thickness. Thus, even when the EL layer has a minute size, almost the whole area can be used as a light-emitting region. Thus, the above manufacturing method achieves both high resolution and a high aperture ratio.

As described above, with the above manufacturing method, a display device in which minute light-emitting elements are integrated can be obtained, and it is not necessary to conduct a pseudo improvement in resolution with a unique pixel arrangement such as a PenTile pattern. Thus, the display device can achieve resolution higher than or equal to 500 ppi, higher than or equal to 1000 ppi, higher than or equal to 2000 ppi, higher than or equal to 3000 ppi, or higher than or equal to 5000 ppi while having what is called a stripe pattern where R, G, and B are arranged in one direction.

Here, it is preferable that a partition covering an end portion of the pixel electrode be not provided. When such a partition is used, a region of the pixel electrode that is covered with the partition is made a non-light-emitting region, reducing the aperture ratio accordingly. In one embodiment of the present invention, the end portion of the pixel electrode has a tapered shape, improving the step coverage with an EL film deposited over the pixel electrode; thus, the EL layer can be prevented from being partitioned by a step at the end portion of the pixel electrode without using the partition. As a result, the aperture ratio can be significantly increased.

More specific structure examples and manufacturing method examples of the display device of one embodiment of the present invention will be described below with reference to drawings.

Structure Example 1

FIG. 1A is a schematic top view of a display device 100 of one embodiment of the present invention. The display device 100 includes, over a substrate 101, a plurality of light-emitting elements 110R exhibiting red, a plurality of light-emitting elements 110G exhibiting green, and a plurality of light-emitting elements 110B exhibiting blue. In FIG. 1A, light-emitting regions of the light-emitting elements are denoted by R, G, and B to easily differentiate the light-emitting elements.

The light-emitting elements 110R, the light-emitting elements 110G, and the light-emitting elements 110B are arranged in a matrix. FIG. 1A shows what is called a stripe arrangement, in which light-emitting elements of the same color are arranged in one direction. Note that the arrangement of the light-emitting elements is not limited thereto; another arrangement such as an S stripe, delta, Bayer, zigzag, PenTile, or diamond pattern may also be used.

As each of the light-emitting elements 110R, 110G, and 110B, an EL element such as an organic light-emitting diode (OLED) or a quantum-dot light-emitting diode (QLED) is preferably used, for example. Examples of a light-emitting substance contained in the EL element include a substance exhibiting fluorescence (fluorescent material), a substance exhibiting phosphorescence (phosphorescent material), and a substance exhibiting thermally activated delayed fluorescence (a thermally activated delayed fluorescent (TADF) material). Examples of the light-emitting substance contained in the EL element include not only organic compounds but also inorganic compounds (e.g., quantum dot materials).

FIG. 1A also illustrates a connection electrode 111C that is electrically connected to a common electrode 113. The connection electrode 111C is supplied with a potential (e.g., an anode potential or a cathode potential) that is to be supplied to the common electrode 113. The connection electrode 111C is provided outside a display region where the light-emitting elements 110R and the like are arranged.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface, a top surface of the connection electrode 111C can have a band shape (a rectangular shape), an L shape, a square bracket shape, a quadrangular shape, or the like.

Figure 1B:
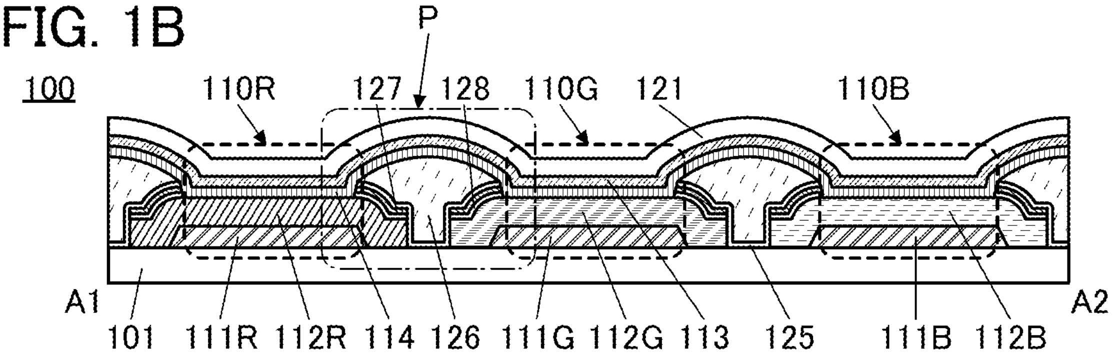
Figure 1C:
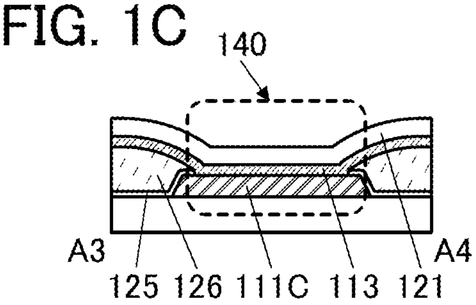

FIGS. 1B and 1C are the schematic cross-sectional views taken along dashed-dotted line A1-A2 and dashed-dotted line A3-A4 in FIG. 1A. FIG. 1B is a schematic cross-sectional view of the light-emitting element 110R, the light-emitting element 110G, and the light-emitting element 110B, and FIG. 1C is a schematic cross-sectional view of a connection portion 140 to which the connection electrode 111C and the common electrode 113 are connected.

The light-emitting element 110R includes a pixel electrode 111R, an organic layer 112R, a common layer 114, and the common electrode 113. The light-emitting element 110G includes a pixel electrode 111G, an organic layer 112G, the common layer 114, and the common electrode 113. The light-emitting element 110B includes a pixel electrode 111B, an organic layer 112B, the common layer 114, and the common electrode 113. The common layer 114 and the common electrode 113 are shared by the light-emitting element 110R, the light-emitting element 110G, and the light-emitting element 110B.

The organic layer 112R of the light-emitting element 110R contains at least a light-emitting organic compound emitting red light. The organic layer 112G of the light-emitting element 110G contains at least a light-emitting organic compound emitting green light. The organic layer 112B of the light-emitting element 110B contains at least a light-emitting organic compound emitting blue light. Each of the organic layers 112R, 112G, and 112B can also be referred to as an EL layer, and includes at least a layer containing a light-emitting organic compound (a light-emitting layer).

Hereafter, the term "light-emitting element 110" is sometimes used to describe matters common to the light-emitting elements 110R, 110G, and 110B. Likewise, in the description of matters common to the components that are distinguished using alphabets, such as the organic layers 112R, 112G, and 112B, reference numerals without such alphabets are sometimes used.

The organic layer 112 and the common layer 114 can each independently include one or more of an electron-injection layer, an electron-transport layer, a hole-injection layer, and a hole-transport layer. For example, the organic layer 112 can include a hole-injection layer, a hole-transport layer, a light-emitting layer, and an electron-transport layer that are stacked from the pixel electrode 111 side, and the common layer 114 can include an electron-injection layer.

The pixel electrode 111R, the pixel electrode 111G, and the pixel electrode 111B are provided for the respective light-emitting elements. Each of the common electrode 113 and common layer 114 is provided as a continuous layer shared by the light-emitting elements. A conductive film that has a property of transmitting visible light is used for either the respective pixel electrodes or the common electrode 113, and a reflective conductive film is used for the other. When the respective pixel electrodes are light-transmitting electrodes and the common electrode 113 is a reflective electrode, a bottom-emission display device is obtained. When the respective pixel electrodes are reflective electrodes and the common electrode 113 is a light-transmitting electrode, a top-emission display device is obtained. Note that when both the respective pixel electrodes and the common electrode 113 transmit light, a dual-emission display device can be obtained.

A protective layer 121 is provided over the common electrode 113 so as to cover the light-emitting elements 110R, 110G, and 110B. The protective layer 121 has a function of preventing diffusion of impurities such as water into each light-emitting element from above.

The pixel electrode 111 preferably has an end portion with a tapered shape. In the case where the pixel electrode has an end portion with a tapered shape, a portion of the organic layer 112 that is provided along a side surface of the pixel electrode also has a tapered shape. When the side surface of the pixel electrode is tapered, coverage with an EL layer provided along the side surface of the pixel electrode can be improved. The side surface of the pixel electrode having such a tapered shape is preferred because it allows a foreign matter (such as dust or particles) mixing during the manufacturing process to be easily removed by treatment such as cleaning.

In this specification and the like, a tapered shape indicates a shape in which at least part of a side surface of a structure is inclined to a substrate surface. For example, a tapered shape preferably includes a region where the angle between the inclined side surface and the substrate surface (such an angle is also referred to as a taper angle) is less than 90°.

The organic layer 112 has an island shape as a result of processing by photolithography. Thus, the angle formed between a top surface and a side surface of an end portion of the organic layer 112 is approximately 90°. By contrast, an organic film formed using a fine metal mask (FMM) or the like has a thickness that tends to gradually decrease with decreasing distance to an end portion, and has a top surface forming a slope in an area extending greater than or equal to 1 μm and less than or equal to 10 μm from the end portion, for example; thus, such an organic film has a shape whose top surface and side surface cannot be easily distinguished from each other.

Figure 2:
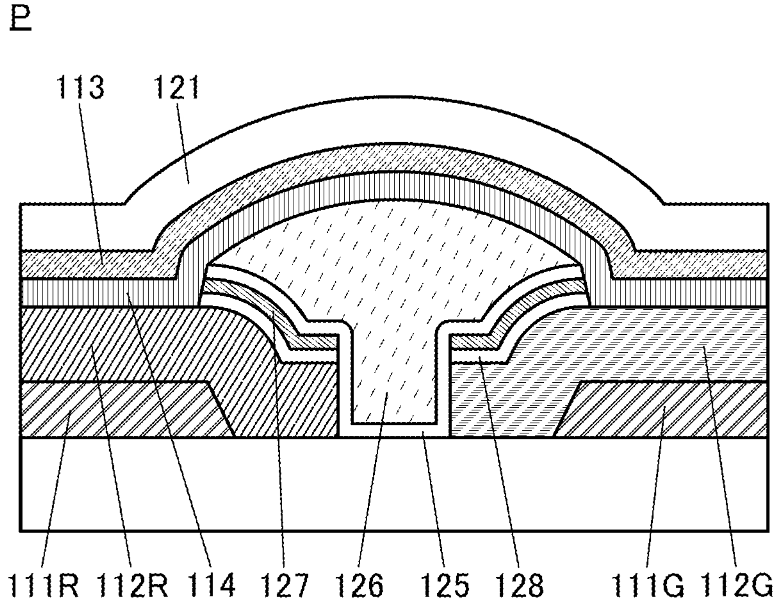
FIG. 2 illustrates a structure example of a display device.

An insulating layer 125, a resin layer 126, a layer 127, and a layer 128 are included between two adjacent light-emitting elements. FIG. 2 is an enlarged view of a region P including part of the light-emitting element 110R, part of the light-emitting element 110G, and a region therebetween.

Between two adjacent light-emitting elements, a side surface of the organic layer 112 of one light-emitting element faces a side surface of the organic layer 112 of the other light-emitting element with a resin layer 126 between the side surfaces. The resin layer 126 is positioned between two adjacent light-emitting elements so as to fill the region between the end portions of their organic layers 112 and the region between the two organic layers 112. The resin layer 126 has a top surface with a smooth convex shape. The top surface of the resin layer 126 is covered with the common layer 114 and the common electrode 113.

The resin layer 126 functions as a planarization film that fills a step between two adjacent light-emitting elements. For example, providing the resin layer 126 can prevent a phenomenon in which the common electrode 113 is divided by a step at an end portion of the organic layer 112 (also referred to as disconnection) from occurring and the common electrode 113 over the organic layer 112 from being insulated. The resin layer 126 can also be referred to as a local filling planarization (LFP) layer.

An insulating layer containing an organic material can be suitably used as the resin layer 126. Examples of materials used for the resin layer 126 include an acrylic resin, a polyimide resin, an epoxy resin, an imide resin, a polyamide resin, a polyimide-amide resin, a silicone resin, a siloxane resin, a benzocyclobutene-based resin, a phenol resin, and precursors of these resins. The resin layer 126 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin.

A photosensitive resin can also be used for the resin layer 126. A photoresist may be used for the photosensitive resin. As the photosensitive resin, a positive photosensitive material or a negative photosensitive material can be used.

The resin layer 126 may contain a material absorbing visible light. For example, the resin layer 126 itself may be made of a material absorbing visible light, or the resin layer 126 may contain a pigment absorbing visible light. For example, the resin layer 126 can be formed using a resin that can be used as a color filter transmitting red, blue, or green light and absorbing light of the other colors; or a resin that contains carbon black as a pigment and functions as a black matrix.

The insulating layer 125 is provided to be in contact with the side surface of the organic layer 112 and to cover an upper end portion of the organic layer 112. Part of the insulating layer 125 is in contact with a top surface of the substrate 101.

The insulating layer 125 is positioned between the resin layer 126 and the organic layer 112 to function as a protective film for preventing contact between the resin layer 126 and the organic layer 112. In the case of bringing the resin layer 126 into contact with the organic layer 112, the organic layer 112 might be dissolved by an organic solvent or the like used in formation of the resin layer 126. In view of this, the insulating layer 125 is provided between the organic layer 112 and the resin layer 126 as described in this embodiment to protect the side surface of the organic layer.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, when a metal oxide film such as an aluminum oxide film or a hafnium oxide film or an inorganic insulating film such as a silicon oxide film that is formed by an ALD method is used for the insulating layer 125, the insulating layer 125 has a small number of pin holes and excels in a function of protecting the organic layer 112.

Note that in this specification and the like, oxynitride refers to a material in which an oxygen content is higher than a nitrogen content, and nitride oxide refers to a material in which a nitrogen content is higher than an oxygen content. For example, silicon oxynitride refers to a material in which an oxygen content is higher than a nitrogen content, and silicon nitride oxide refers to a material in which a nitrogen content is higher than an oxygen content.

The insulating layer 125 can be formed by a sputtering method, a CVD method, a PLD method, an ALD method, or the like. The insulating layer 125 is preferably formed by an ALD method achieving good coverage.

Between the insulating layer 125 and the resin layer 126, a reflective film (e.g., a metal film containing one or more of silver, palladium, copper, titanium, aluminum, and the like) may be provided to reflect the light that is emitted from the light-emitting layer. In this case, the light extraction efficiency can be increased.

At the upper end portion of the organic layer 112, the resin layer 126 is provided to cover the top surface of the organic layer 112. The layer 128, the layer 127, and the insulating layer 125 are stacked in this order between the top surface of the organic layer 112 and the resin layer 126. The layer 128 is provided in contact with the top surface of the organic layer 112.

Part of a protective layer (also referred to as a mask layer or a sacrificial layer) for protecting the organic layer 112 during etching of the organic layer 112 survives the etching to become the layer 128. For the layer 128, the material that can be used for the insulating layer 125 can be used. Particularly, the layer 128 and the insulating layer 125 are preferably formed with the same material, in which case an apparatus or the like for processing can be used in common.

In particular, since a metal oxide film such as an aluminum oxide film or a hafnium oxide film and an inorganic insulating film such as a silicon oxide film which are formed by an ALD method have a small number of pinholes, when any of these films is used for the layer 128, the insulating layer 125 that excels in a function of protecting the EL layer can be formed.

In particular, an insulating film capable of being processed by wet etching is preferably used for the layer 128. Since the layer 128 is a film in contact with the top surface of the organic layer 112, wet etching that gives less damage to a surface where the layer 128 is formed is employed for processing the layer 128, in which case the reliability of the light-emitting element can be improved.

Part of the protective layer (also referred to as a light-blocking layer) that prevents the organic layer 112 from being irradiated with light used in the light exposure step in the process of manufacturing the resin layer 126 remains to become the layer 127. For the layer 127, a film formed of a material different from that of the insulating layer 125 and the layer 128 is preferably used. Thus, the insulating layer 125, the layer 127, and the layer 128 can be processed gradually, which is preferable because a processed shape can be easily controlled.

As the layer 127, a film containing a material having a light-blocking property, particularly with respect to ultraviolet light, can be used. For example, a film having an ultraviolet light-reflecting property or a film absorbing ultraviolet light can be used. Although a variety of materials, such as a metal having an ultraviolet light-blocking property, an insulator, a semiconductor, or a metalloid, can be used for the layer 127, a film capable of being processed by etching is preferable, and a film having good processability is particularly preferable because part or the whole of the layer to be the layer 127 is removed after the formation of the resin layer 126.

For example, a semiconductor material such as silicon or germanium can be used as a material that can be used for the layer 127 and has an affinity for the semiconductor manufacturing process. Alternatively, oxide or nitride of the semiconductor material can be used. Alternatively, a nonmetallic metal material, such as carbon, a metalloid material, or a compound thereof can be used. Alternatively, a metal, such as titanium, tantalum, tungsten, chromium, or aluminum, or an alloy containing one or more of these metals can be used. Alternatively, oxide containing the above-described metal, such as titanium oxide or chromium oxide, or nitride, such as titanium nitride, nitride chromium, or tantalum nitride, can be used.

The protective layer 121 is formed to cover the common electrode 113.

The protective layer 121 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material or a conductive material such as indium gallium oxide, indium zinc oxide, indium tin oxide, or indium gallium zinc oxide may be used for the protective layer 121.

As the protective layer 121, a stacked film of an inorganic insulating film and an organic insulating film can be used. For example, a structure in which an organic insulating film is sandwiched between a pair of inorganic insulating films is preferable. Furthermore, it is preferable that the organic insulating film function as a planarization film. With this structure, a top surface of the organic insulating film can be flat, and accordingly, coverage with the inorganic insulating film over the organic insulating film is improved, leading to an improvement in barrier properties. Moreover, since a top surface of the protective layer 121 is flat, a preferable effect can be obtained; when a component (e.g., a color filter, an electrode of a touch sensor, a lens array, or the like) is provided above the protective layer 121, the component is less affected by an uneven shape caused by the lower structure.

FIG. 1C illustrates a connection portion 140 in which the connection electrode 111C is electrically connected to the common electrode 113. In the connection portion 140, an opening portion is provided in the insulating layer 125 and the resin layer 126 over the connection electrode 111C. In the opening portion, the connection electrode 111C and the common electrode 113 are electrically connected to each other.

Although FIG. 1C illustrates the connection portion 140 in which the connection electrode 111C and the common electrode 113 are electrically connected to each other, the common electrode 113 may be provided over the connection electrode 111C with the common layer 114 therebetween. Particularly in the case of the common layer 114 that includes a carrier-injection layer, for example, the common layer 114 can be formed to be thin using a material with sufficiently low electrical resistivity and thus can be in the connection portion 140 almost without causing any problem. Accordingly, the common electrode 113 and the common layer 114 can be formed using the same shielding mask, whereby manufacturing costs can be reduced.

Structure Example 2

Structure examples of a display device partly different from the above structure example are described below. In the following description, portions similar to those in Structure example 1 are denoted by the same reference numerals as those in Structure example 1, and the description thereof is not repeated in some cases.

Figure 3A:
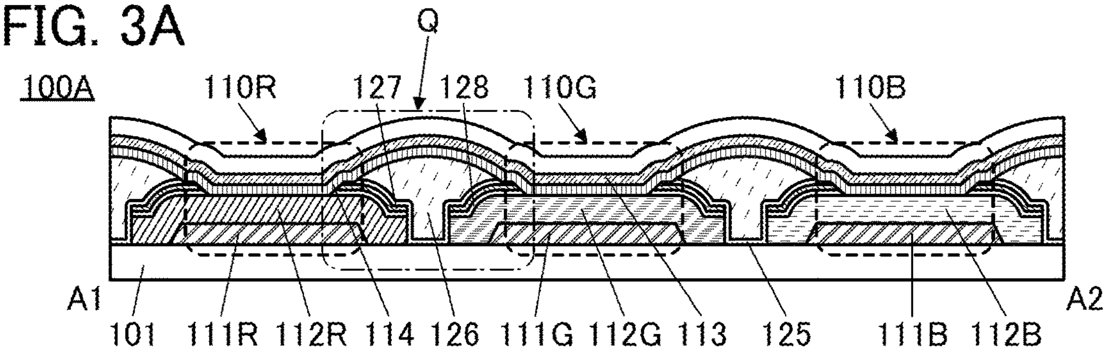
FIGS. 3A to 3D illustrate structure examples of a display device.
Figure 3B:
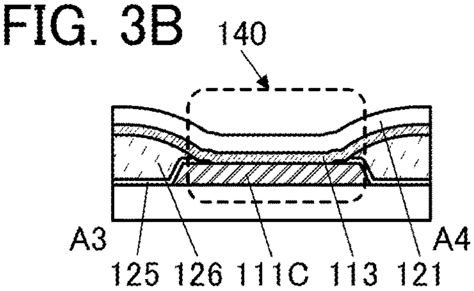

FIGS. 3A and 3B are schematic cross-sectional views of a display device 100A. Main differences between the display device 100A and the display device in Structure example 1 are the shapes of the insulating layer 125, the layer 127, and the layer 128.

Figure 3C:
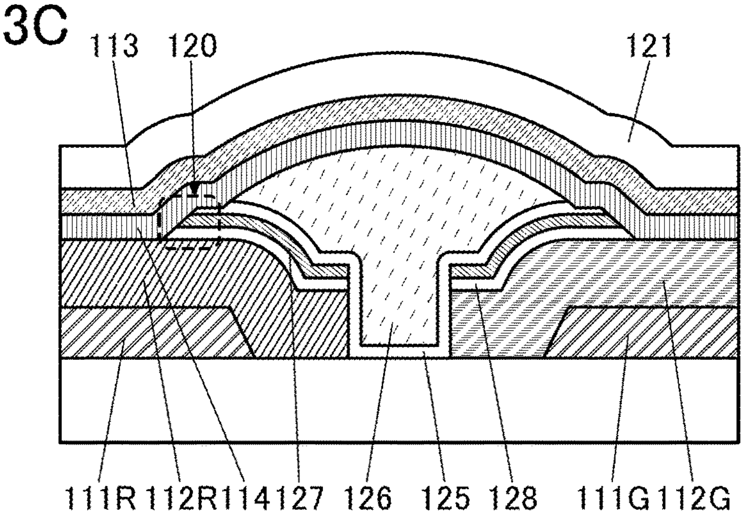

FIG. 3C is an enlarged view showing part of the light-emitting element 110R, part of the light-emitting element 110G, and a region Q between these in FIG. 3A.

As illustrated in FIG. 3C, the insulating layer 125, the layer 127, and the layer 128 over the organic layer 112 have portions (projecting portions 120) projecting outside end portions of the resin layer 126. FIG. 3C illustrates an example in which the projecting portion 120 includes the insulating layer 125, the layer 127, and the layer 128, but the projecting portion 120 may include one or two of them.

Each of the end portions of the insulating layer 125, the layer 127, and the layer 128 has a tapered shape. This improves the step coverage with the common layer 114 and the common electrode 113, and thus disconnection can be inhibited from occurring in the vicinity of the end portions of the insulating layer 125, the layer 127, and the layer 128.

In the projecting portion 120, a top surface of the insulating layer 125 is in contact with the common layer 114. The thickness of the insulating layer 125 positioned in the projecting portion 120 is smaller than the thickness of the insulating layer 125 in a portion covered with the resin layer 126.

Figure 3D:
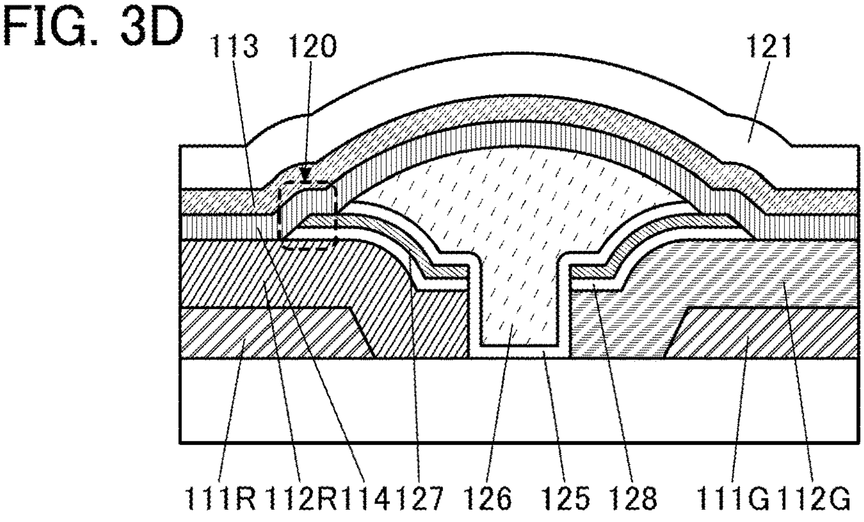

FIG. 3D illustrates an example in which the projecting portion 120 is formed with the layer 127 and the layer 128. As illustrated in FIG. 3D, in the projecting portion 120, a top surface of the layer 127 may be in contact with the common layer 114. In that case, the end portion of the insulating layer 125 preferably has a tapered shape.

For example, in FIGS. 3C and 3D, the taper angle of each of the insulating layer 125, the layer 127, and the layer 128 is less than 90°, preferably less than or equal to 60°, further preferably less than or equal to 45°, and still further preferably less than or equal to 30°. Note that the taper angle refers to an angle formed by a bottom surface and a side surface of the layer.

Manufacturing Method Example 1

A manufacturing method example of the display device of one embodiment of the present invention will be described below with reference to drawings. Here, the description is made with use of the display device 100 shown above in Structure example 1. FIGS. 4A to 4H, FIGS. 5A to 5G and FIGS. 6A to 6C are cross-sectional schematic views of steps in the manufacturing method of the display device described as an example below.

Thin films included in the display device (e.g., insulating films, semiconductor films, and conductive films) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. An example of the thermal CVD method is a metal organic CVD (MOCVD) method.

Thin films included in the display device (e.g., insulating films, semiconductor films, and conductive films) can also be formed by a method such as spin coating, dipping, spray coating, ink-jetting, dispensing, screen printing, offset printing, doctor blade coating, slit coating, roll coating, curtain coating, or knife coating.

Thin films included in the display device can be processed by a photolithography method, for example. Besides, a nanoimprinting method, a sandblasting method, a lift-off method, or the like may be used to process thin films. Alternatively, island-shaped thin films may be directly formed by a film formation method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light used for light exposure in the photolithography method, for example, light with an i-line (wavelength: 365 nm), light with a g-line (wavelength: 436 nm), light with an h-line (wavelength: 405 nm), or light in which the i-line, the g-line, and the h-line are mixed can be used. Alternatively, ultraviolet light, KrF laser light (wavelength: 248 nm), ArF laser light (wavelength: 193 nm), or the like can be used. Exposure may be performed by liquid immersion exposure technique. As the light for exposure, extreme ultraviolet (EUV) light having a wavelength greater than or equal to 10 nm and less than or equal to 100 nm or X-rays may also be used. Furthermore, instead of the light used for the exposure, an electron beam can also be used. It is preferable to use EUV light, X-rays, or an electron beam because extremely minute processing can be performed. Note that when exposure is performed by scanning of a beam such as an electron beam, a photomask is not needed.

For etching of thin films, a dry etching method, a wet etching method, a sandblast method, or the like can be used.

[Preparation for Substrate 101]

As the substrate 101, a substrate that has heat resistance high enough to withstand at least heat treatment performed later can be used. As the substrate 101 having an insulating property, a glass substrate, a quartz substrate, a sapphire substrate, a ceramic substrate, an organic resin substrate, or the like can be used. Alternatively, it is possible to use a semiconductor substrate such as a single crystal semiconductor substrate or a polycrystalline semiconductor substrate of silicon, silicon carbide, or the like; a compound semiconductor substrate of silicon germanium or the like; or an SOI substrate.

As the substrate 101, it is particularly preferable to use the above-described semiconductor substrate or insulating substrate where a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

[Formation of Pixel Electrodes 111R, 111G, and 111B]

Figure 4A:
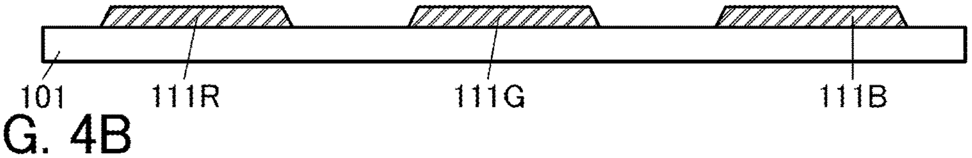
FIGS. 4A to 4H illustrate an example of a method of manufacturing a display device.

Next, a plurality of pixel electrodes 111R, 111G, and 111B are formed over the substrate 101 (FIG. 4A). First, a conductive film to be a pixel electrode is deposited, a resist mask is formed by a photolithography method, and an unnecessary portion of the conductive film is removed by etching. After that, the resist mask is removed to form the pixel electrodes 111R, 111G, and 111B.

At this time, etching is preferably performed so that the pixel electrodes 111R, 111G, and 111B each have a tapered shape. The tapered shape can be obtained by, for example, performing dry etching under the condition that the resist mask can be etched concurrently with the conductive film. Note that the processing method for obtaining the tapered shape is not limited thereto and the tapered shape can also be obtained by wet etching in some cases.

In the case where a conductive film that has a property of reflecting visible light is used as the pixel electrodes 111, it is preferable to use a material having as high a reflectivity as possible in the entire wavelength range of visible light (e.g., silver or aluminum). This can increase both light extraction efficiency and color reproducibility of the light-emitting elements. A light-transmitting conductive film may be stacked over a reflective conductive film, and the light-transmitting conductive film may have a thickness different between the light-emitting elements.

[Formation of Organic Film 112Rf]

Figure 4B:
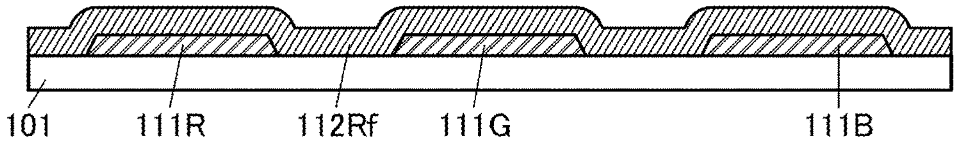

Subsequently, an organic film 112Rf to be the organic layer 112R is deposited over the pixel electrodes 111R, 111G, and 111B (FIG. 4B).

The organic film 112Rf includes at least a film containing a light-emitting compound. In addition to this, one or more films functioning as an electron-injection layer, an electron-transport layer, a charge-generation layer, a hole-transport layer, and a hole-injection layer may be stacked. The organic film 112Rf can be formed by, for example, an evaporation method, a sputtering method, an inkjet method, or the like. Without limitation to this, the above-described deposition method can be used as appropriate.

[Formation of Mask Film 144*a*]

Next, the mask film 144*a* is formed over the organic film 112Rf. As the mask film 144*a*, a film highly resistant to etching treatment performed on EL films such as the organic film 112Rf, i.e., a film having high etching selectivity with respect to the EL films, can be used. Furthermore, as the mask film 144*a*, a film having high etching selectivity with respect to a mask film such as a mask film 146*a* described later can be used. Moreover, as the mask film 144*a*, it is particularly preferable to use a film that can be removed by a wet etching method less likely to cause damage to the EL films.

As the mask film 144*a*, an inorganic film such as a metal film, an alloy film, a metal oxide film, a semiconductor film, or an inorganic insulating film can be suitably used, for example. The mask film 144*a* can be formed by any of a variety of film formation methods such as a sputtering method, an evaporation method, a CVD method, and an ALD method. In particular, an ALD method gives less damage to a layer where a film is to be formed; for this reason, the mask film 144*a*, which is directly formed on the organic film 112Rf, is preferably formed by an ALD method.

Specifically, oxide such as aluminum oxide, hafnium oxide, or silicon oxide, nitride such as silicon nitride or aluminum nitride, or oxynitride such as silicon oxynitride can be used for the mask film 144*a*. Such an inorganic insulating material can be deposited by a sputtering method, a CVD method, or an ALD method, and in particular, an ALD method is preferably used.

The mask film 144*a* can be formed using a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material. It is particularly preferable to use a low-melting-point material such as aluminum or silver.

Alternatively, the mask film 144*a* can be formed using metal oxide such as indium-gallium-zinc oxide (In—Ga—Zn oxide, also referred to as IGZO). It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Indium tin oxide containing silicon can also be used, for example.

The mask film 144*a* may be formed using a material that can be dissolved in a solvent chemically stable with respect to at least the uppermost film of the organic film 112Rf. Specifically, a material that will be dissolved in water or alcohol can be suitably used for the mask film 144*a*. In formation of the mask film 144*a*, it is preferable that application of such a material dissolved in a solvent such as water or alcohol be performed by a wet process and followed by heat treatment for evaporating the solvent. At this time, the heat treatment is preferably performed in a reduced-pressure atmosphere, in which case the solvent can be removed at a low temperature in a short time and thermal damage to the organic film 112Rf can be reduced accordingly.

Examples of a wet film formation method that can be used to form the mask film 144*a* include spin coating, dipping, spray coating, ink-jetting, dispensing, screen printing, offset printing, doctor blade coating, slit coating, roll coating, curtain coating, and knife coating.

The mask film 144*a* can be formed using an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin.

[Formation of Mask Film 146*a*]

Figure 4C:
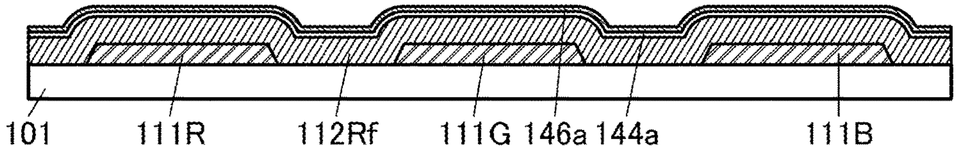

Next, the mask film 146*a* is formed over the mask film 144*a* (FIG. 4C).

Since the mask film 146*a* functions as a light-blocking layer that protects the EL layer from ultraviolet light utilized for the formation of the resin layer 126 and the like, the mask film 146*a* preferably contains a material having a light-blocking property, particularly with respect to ultraviolet light. A film containing a material different from that of the mask film 144*a* is preferably used as the mask film 146*a*.

Among inorganic films such as a metal film, an alloy film, a metal oxide film, a semiconductor film, and an inorganic insulating film, a film having a light-blocking property can be suitably used for the mask film 146*a* to be the layer 127 later, as described above. The mask film 146*a* can be formed by any of a variety of film formation methods such as a sputtering method, an evaporation method, a CVD method, and an ALD method.

For example, a semiconductor film such as a silicon film or a germanium film formed by a sputtering method, a CVD method, or an ALD method can be used as the mask film 146*a*. Typically, an amorphous silicon film formed by a sputtering method can be used.

The mask film 146*a* is a film used as a hard mask when the mask film 144*a* is etched later. In a later step of processing the mask film 146*a*, the mask film 144*a* is exposed. Hence, the combination of films having high etching selectivity therebetween is selected for the mask film 144*a* and the mask film 146*a*. It is thus possible to select a film that can be used as the mask film 146*a* considering an etching condition of the mask film 144*a* and an etching condition of the mask film 146*a*.

[Formation of Resist Mask 143*a*]

Figure 4D:
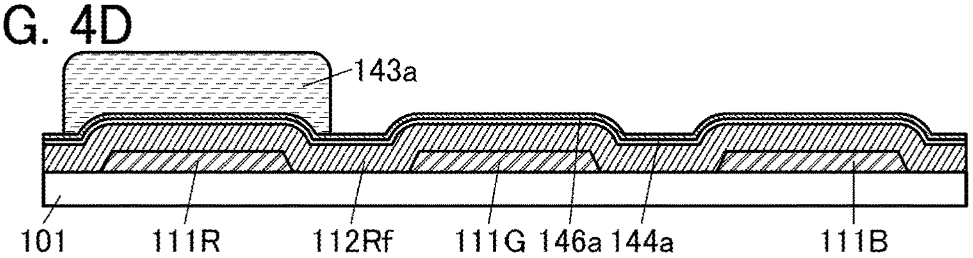

Then, a resist mask 143*a* is formed at a position that is over the mask film 146*a* and overlaps with the pixel electrode 111R (FIG. 4D).

For the resist mask 143*a*, a resist material containing a photosensitive resin such as a positive-type resist material or a negative-type resist material can be used.

On the assumption that the resist mask 143*a* is formed over the mask film 146*a* without the mask film 144*a* therebetween, there is a risk of dissolving the organic film 112Rf due to a solvent of the resist material if a defect such as a pinhole exists in the mask film 146*a*. Such a defect can be prevented by using the mask film 144*a*.

[Etching of Mask Film 146*a*]

Next, part of the mask film 146*a* that is not covered with the resist mask 143*a* is removed by etching, so that an island-shaped mask layer 147*a* is formed.

In the etching of the mask film 146*a*, an etching condition with high selectively is preferably employed so that the mask film 144*a* is not removed by the etching. Either wet etching or dry etching can be performed for the etching of the mask film 146*a*. With use of dry etching, a shrinkage of the pattern of the mask film 146*a* can be inhibited.

[Removal of Resist Mask 143*a*]

Figure 4E:
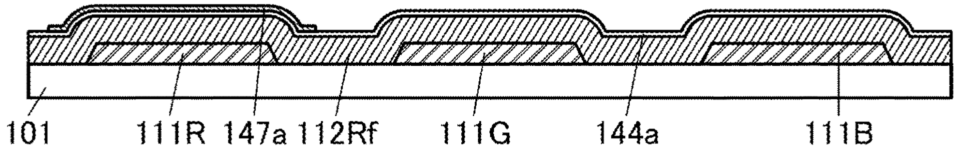

Then, the resist mask 143*a* is removed (FIG. 4E).

The resist mask 143*a* can be removed by wet etching or dry etching. It is particularly preferable to remove the resist mask 143*a* by dry etching using an oxygen gas as an etching gas (also referred to as plasma ashing).

At this time, the removal of the resist mask 143*a* is performed in a state where the organic film 112Rf is covered with the mask film 144*a*; thus, the organic film 112Rf is less likely to be affected by the removal. In particular, if the organic film 112Rf is exposed to oxygen, the electrical characteristics of the light-emitting device are adversely affected in some cases. Therefore, it is preferable that the organic film 112Rf be covered by the mask film 144*a* when etching using an oxygen gas, such as plasma ashing, is performed.

[Etching of Mask Film 144*a*]

Next, part of the mask film 144*a* that is not covered with the mask layer 147*a* is removed by etching with use of the mask layer 147*a* as a mask, so that an island-shaped mask layer 145*a* is formed.

Either wet etching or dry etching can be performed for the etching of the mask film 144*a*. The use of dry etching is preferable, in which case a shrinkage of the pattern of the mask film 144*a* can be inhibited.

[Etching of Organic Film 112Rf]

Figure 4F:
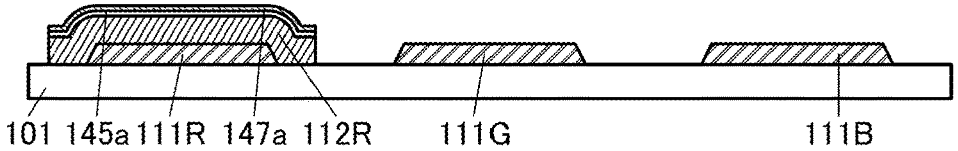

Next, part of the organic film 112Rf that is not covered with the mask layer 145*a* resist mask 143*a* is removed by etching, so that the island-shaped organic layer 112R is formed (FIG. 4F). By the etching of the organic film 112Rf, top surfaces of the pixel electrode 111G, the pixel electrode 111B, and the substrate 101 are exposed.

The organic film 112Rf is preferably etched by anisotropic dry etching using an etching gas containing oxygen, in which case the etching rate can be increased. An etching gas that does not contain oxygen as a main component may be used.

Note that the etching gas is not limited thereto, and a hydrogen gas, a nitrogen gas, an oxygen gas, an ammonia gas, a chlorine gas, a noble gas, a gas containing fluorine such as $CF_4$, $C_4F_8$, $SF_6$, or $CHF_3$, or a gas containing chlorine such as $BCl_3$ can be used as the etching gas, for example. A mixed gas of two or more of the above gases may also be used. Alternatively, a gas in which a noble gas such as argon, helium, xenon, or krypton is mixed in any of the above gases may be used as the etching gas.

[Formation of Organic Film 112Gf]

Next, an organic film 112Gf to be the organic layer 112G is formed over the mask layer 147*a*, the pixel electrode 111G, and the pixel electrode 111B.

For the method of forming the organic film 112Gf, description of the organic film 112Rf can be referred to.

[Formation of Mask Film 144*b*]

Next, a mask film 144*b* is formed over the organic film 112Gf. The mask film 144*b* can be formed in a manner similar to that for the mask film 144*a*. In particular, the mask film 144*b* and the mask film 144*a* are preferably formed with the same material.

[Formation of Mask Film 146*b*]

Figure 4G:
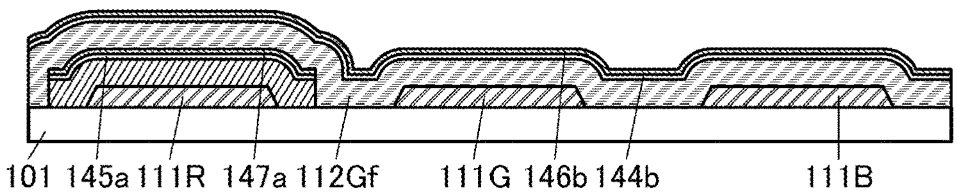

Next, a mask film 146*b* is formed over the mask film 144*b* (FIG. 4G). The mask film 146*b* can be formed in a manner similar to that for the mask film 146*a*. In particular, the mask film 146*b* and the mask film 146*a* are preferably formed with the same material.

[Formation of Resist Mask 143*b*]

Figure 4H:
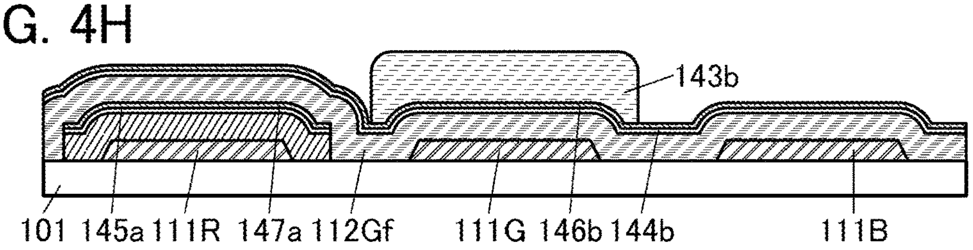

Next, a resist mask 143*b* is formed over the mask film 146*b* (FIG. 4H). The resist mask 143*b* is formed in a region overlapping with the pixel electrode 111G.

The resist mask 143*b* can be formed in a manner similar to that for the resist mask 143*a*.

[Etching of Mask Film 146*b*]

Next, part of the mask film 146*b* that is not covered with the resist mask 143*b* is removed by etching, so that an island-shaped mask layer 147*b* is formed.

For the etching of the mask film 146*b*, the above description of the mask film 146*a* can be referred to.

[Removal of Resist Mask 143*b*]

Then, the resist mask 143*b* is removed. For the removal of resist mask 143*b*, the above description of the resist mask 143*a* can be referred to.

[Etching of Mask Film 144*b*]

Next, part of the mask film 144*b* that is not covered with the mask layer 147*b* is removed by etching with use of the mask layer 147*b* as a mask, so that an island-shaped mask layer 145*b* is formed.

For the etching of the mask film 144*b*, the above description of the mask film 144*a* can be referred to.

[Etching of Organic Film 112Gf]

Figure 5A:
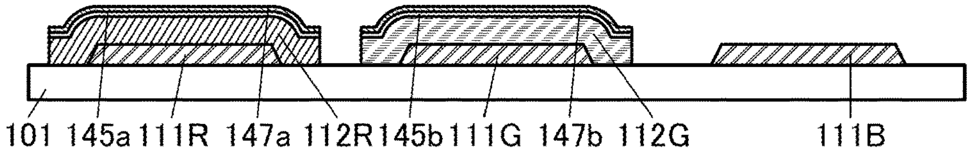
FIGS. 5A to 5G illustrate an example of a method of manufacturing a display device.

Next, part of the organic film 112Gf that is not covered with the resist mask 143*b* is removed by etching, so that the island-shaped organic layer 112G is formed (FIG. 5A).

The description of the organic film 112Rf can be referred to for the etching of the organic film 112Gf.

In that case, since the organic layer 112R is protected by the mask layer 145*a* and the mask layer 147*a*, the organic layer 112R can be prevented from being damaged in the process of etching the organic film 112Gf.

In the above manner, the island-shaped organic layer 112R and the island-shaped organic layer 112G can be separately formed with high positional accuracy.

[Formation of Organic Layer 112B]

Figure 5B:
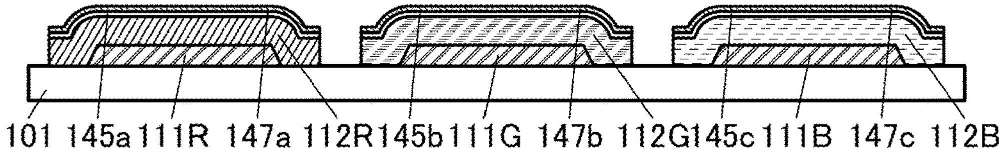

The above-described steps are performed on an organic film 112Bf (not illustrated), whereby the organic layer 112B, a mask layer 145*c*, and a mask layer 147*c* which have an island shape can be formed (FIG. 5B).

That is, after the formation of the organic layer 112G, the organic film 112Bf, a mask film 144*c*, a mask film 146*c*, and a resist mask 143*c* (each of which is not illustrated) are sequentially formed. Next, the mask film 146*c* is etched to form the mask layer 147*c*, and then, the resist mask 143*c* is removed. Subsequently, the mask film 144*c* is etched to form the mask layer 145*c*. After that, the organic film 112Bf is etched to form the organic layer 112B with an island shape or a band shape.

Through the above steps, three kinds of EL layers can be formed with high positional accuracy.

[Formation of Insulating Film 125*f*]

Figure 5C:
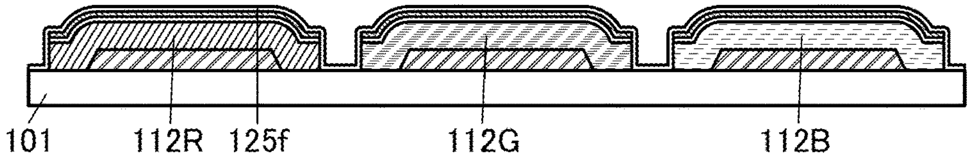

Next, an insulating film 125*f* is formed to cover the mask layer 147*a*, the mask layer 147*b*, and the mask layer 147*c* (FIG. 5C).

The insulating film **125*f* is a film to be the insulating layer 125 later. The thickness of the insulating film 125*f*** is preferably greater than or equal to 3 nm, greater than or equal to 5 nm, or greater than or equal to 10 nm and less than or equal to 200 nm, less than or equal to 150 nm, less than or equal to 100 nm, or less than or equal to 50 nm.

The insulating film **125*f*, which is formed in contact with a side surface of the EL layer, is preferably formed by a formation method that causes less damage to the EL layer. The insulating film 125*f* is formed at a temperature lower than the upper temperature limit of the EL layer. The typical substrate temperatures in formation of the insulating film 125*f* and the resin layer 126** are lower than or equal to 200° C., preferably lower than or equal to 180° C., further preferably lower than or equal to 160° C., still further preferably lower than or equal to 150° C., and yet still further preferably lower than or equal to 140° C.

For the insulating film **125*f*, a material different from that of the mask film 146*a* is preferably used, and further preferably, the same material as the mask film 144*a*** is used. For example, an aluminum oxide film is preferably formed by an ALD method. The use of an ALD method is preferable, in which case damage by the deposition is reduced and a film with good coverage can be formed.

[Formation of Resin Layer 126]

Figure 5D:
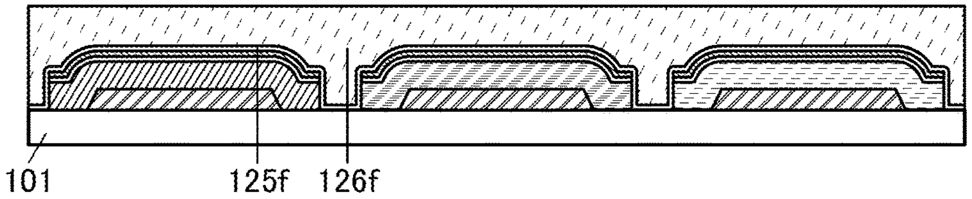
Figure 5E:
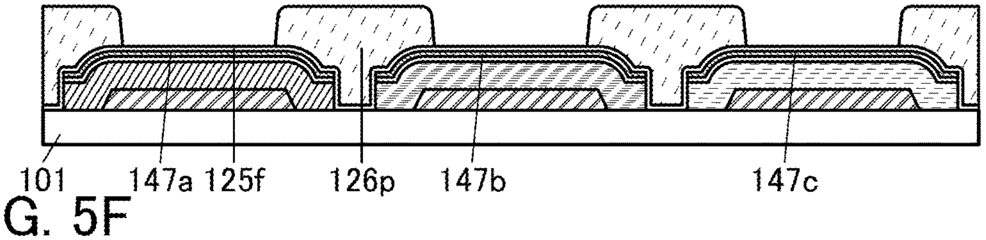

Next, a resin film **126*f* is formed to cover the insulating film 125*f* (FIG. 5D). A photosensitive organic resin is preferably used for the insulating film 125*f***. In particular, a photosensitive acrylic resin can be used. Note that in this specification and the like, an acrylic resin refers to not only a polymethacrylic acid ester or a methacrylic resin, but also all the acrylic polymer in a broad sense in some cases.

The resin film **126*f*** is preferably formed by a spin coating method or an ink-jet method, for example. The method is not limited to these, and for example, a wet film-formation method such as dipping, spray coating, dispensing, screen printing, offset printing, doctor blade coating, slit coating, roll coating, curtain coating, or knife coating can be used.

After the resin film **126*f* is applied, first heat treatment (also referred to as pre-baking) is preferably performed to eliminate a solvent or the like contained in the resin film 126*f*** The heat treatment is conducted at a temperature lower than the upper temperature limit of the EL layer. The substrate temperature in the heat treatment is higher than or equal to 50° C. and lower than or equal to 200° C., preferably higher than or equal to 60° C. and lower than or equal to 150° C., and more preferably higher than or equal to 70° C. and lower than or equal to 120° C.

Next, the resin film **126*f* is subjected to light exposure with use of a photomask, so that part of the resin film 126*f* is irradiated with visible light or ultraviolet light. In the case where a positive resin is used for the resin film 126*f*, a region other than a region to be the resin layer 126 later is irradiated with light, that is, a region overlapping with the pixel electrode 111 is irradiated with light of light exposure. However, each of the organic layers 112 is covered with the mask layer 147*a*, the mask layer 147*b*, or the mask layer 147*c*** which have a light-blocking property, which can inhibit damage due to the light. Therefore, a highly reliable display device can be achieved.

Note that even when a negative resin is used for the resin film **126*f*, part of light is scattered to enter the organic layer 112 in some cases. Therefore, when light exposure is performed in a state where the organic layer 112 is covered with the mask layer 147*a*, the mask layer 147*b*, or the mask layer 147*c***, the influence by scattered light can be reduced.

Next, development is performed to remove part of the resin film **126*f*, whereby the patterned resin layer 126*p* can be formed (FIG. 5**E).

Figure 5F:
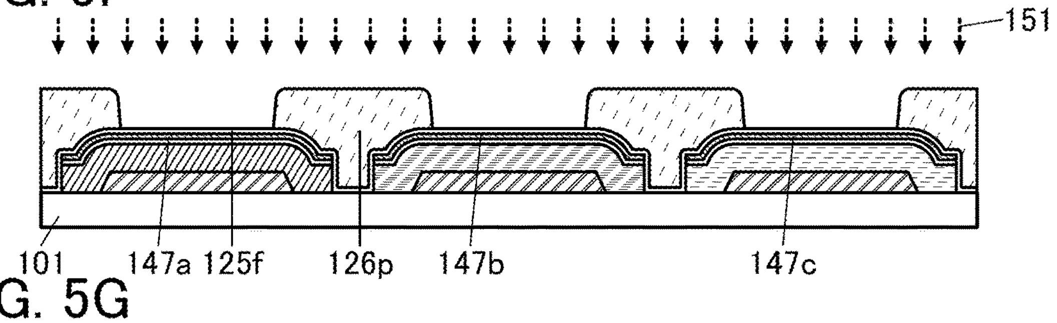

Next, as illustrated in FIG. 5F, light 151 may be emitted so that the resin layer **126*p* is exposed to the light. The irradiation of the resin layer 126*p* with the light 151 can sometimes decrease the temperature required for curing the resin layer 126*p*. At this time, the whole substrate 101 is irradiated with the light 151** without a photomask, so that the process can be simplified and light exposure unevenness can be inhibited.

At this time, since the organic layer 112 is protected by the mask layer **147*a*, the mask layer 147*b*, or the mask layer 147*c*, damage due to the light 151** is inhibited.

Figure 5G:
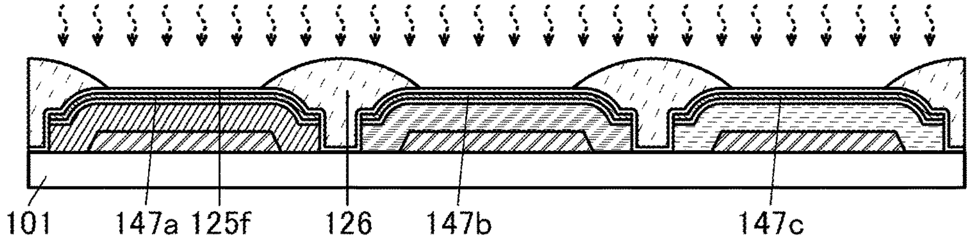

Next, second heat treatment (also referred to as post-baking) is preferably performed to change the shape of the resin layer **126*p* (FIG. 5G). In that case, the resin layer 126 after being changed in shape preferably has a small taper angle and a gently curved top surface as compared with the resin layer 126*p*** before being changed in shape.

[Formation of Insulating Layer 125, Layer 127, and Layer 128]

Figure 6A:
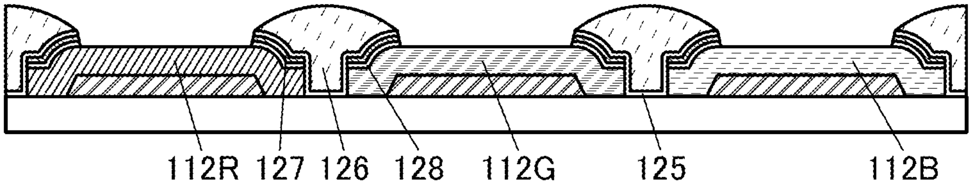
FIGS. 6A to 6C illustrate an example of a method of manufacturing a display device.

Next, the insulating layer 125, the mask layer 145, and the mask layer 147 are etched using the resin layer 126 as a mask to expose the top surface of the organic layer 112 (FIG. 6A).

Although either dry etching or wet etching or the both can be employed for the etching of the insulating layer 125, the mask layer 145, and the mask layer 147, wet etching is preferably used for etching at the stage of exposing the organic layer 112. For example, the insulating layer 125 and the mask layer 145 are processed by dry etching such that part or the whole of the mask layer 147 remains over the organic layer 112, and the mask layer 147 finally left is processed by wet etching; thus, etching damage to the organic layer 112 can be inhibited.

The mask layer **147*a*, the mask layer 147*b*, and the mask layer 147*c* are processed, whereby the layer 127 can be formed. The mask layer 145*a*, the mask layer 145*b*, and the mask layer 145*c* are processed, whereby the layer 128** can be formed.

[Formation of Common Layer 114 and Common Electrode 113]

Next, the common layer 114 is formed to cover the organic layer 112R, the organic layer 112G, the organic layer 112B, and the resin layer 126. The common layer 114 can be formed by a sputtering method or a vacuum evaporation method, for example.

Figure 6B:
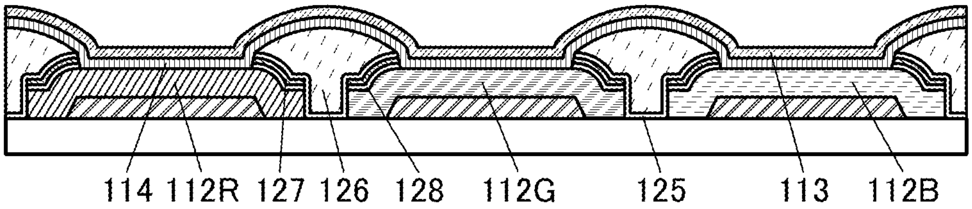

Next, the common electrode 113 is formed to cover the common layer 114 (FIG. 6B). The common electrode 113 can be formed by a sputtering method or a vacuum evaporation method, for example.

The common layer 114 and the common electrode 113 are not necessarily deposited over the entire surface of the substrate 101, and preferably deposited with the use of a shielding mask (also referred to as a metal mask or a rough metal mask) to define a deposition area. It is preferable that the common layer 114 be deposited in a region where the light-emitting element is provided and the common electrode 113 be deposited in a predetermined region including a region where the light-emitting element is provided and a region where an electrode electrically connected to the common electrode 113 is provided.

Through the above steps, the light-emitting element 110R, the light-emitting element 110G, and the light-emitting element 110B can be manufactured.

[Formation of Protective Layer 121]

Figure 6C:
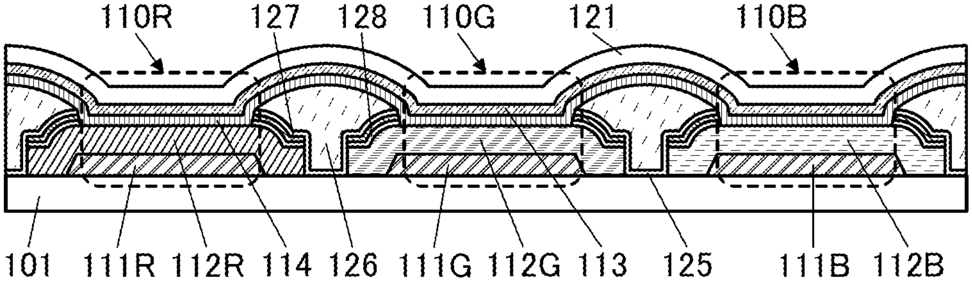

Next, the protective layer 121 is formed over the common electrode 113 (FIG. 6C). An inorganic insulating film used for the protective layer 121 is preferably deposited by a sputtering method, a PECVD method, or an ALD method. In particular, the ALD method is preferable because a film deposited by ALD has good step coverage and is less likely to cause a defect such as pinhole. An organic insulating film is preferably deposited by an ink-jet method because a uniform film can be formed in a desired area.

The above is the description of the manufacturing method example of the display device.

Manufacturing Method Example 2

A manufacturing method example of the above-described display device 100A is described below. Note that for portions the same as those described in Manufacturing method example 1 in the above, Manufacturing method example 1 is referred to and the description is omitted in some cases.

Figure 7A:
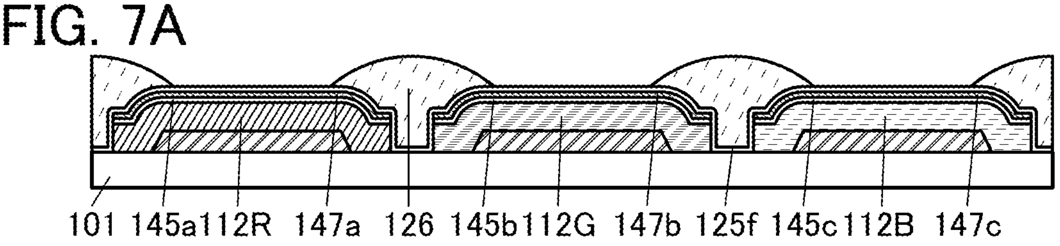
FIGS. 7A to 7E illustrate an example of a method of manufacturing a display device.

First, steps up to formation of the resin layer 126 are conducted as in Manufacturing method example 1 in the above. FIG. 7A is a schematic cross-sectional view at a stage when the second heat treatment is performed to form the resin layer 126 changed in shape.

Figure 7B:
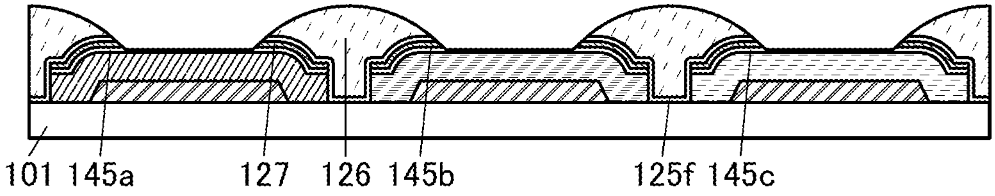
Figure 8A:
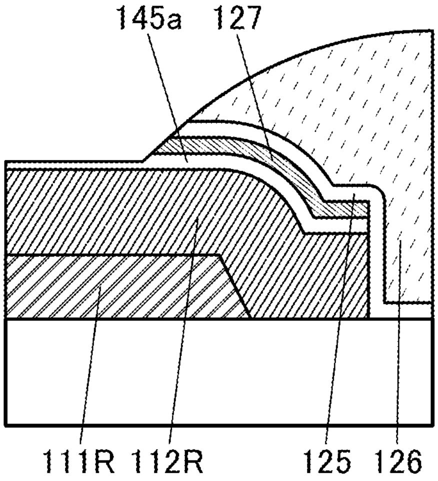
FIGS. 8A to 8C illustrate an example of a method of manufacturing a display device.

Next, the insulating film 125*f*, the mask layer 147, and the mask layer 145 are etched using the resin layer 126 as a mask such that the organic layer 112 is not exposed (FIG. 7B). FIG. 8A is an enlarged view of the vicinity of an end portion of the organic layer 112R at this stage.

The insulating film 125*f*, the mask layer 147, and the mask layer 145 are preferably processed to have tapered end portions. For this reason, dry etching is preferably used because end portions of processed films are easily processed into tapered shapes. Note that the etching is not limited to dry etching and wet etching may be employed.

Figure 7C:
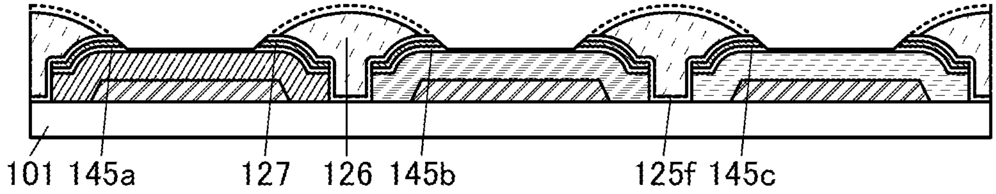
Figure 8B:
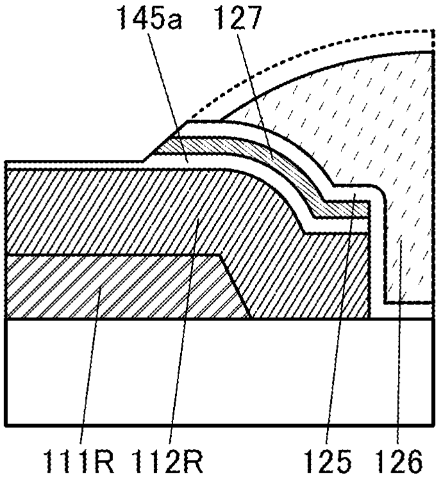

Next, part of the resin layer 126 is etched to be recessed (FIG. 7C and FIG. 8B). The resin layer 126 can be etched by dry etching (also referred to as ashing) using oxygen as an etching gas, for example. The use of dry etching can inhibit variations in shape of the resin layer 126.

The resin layer 126 is isotropically recessed, so that part of the top surface of the insulating layer 125 is exposed.

Figure 7D:
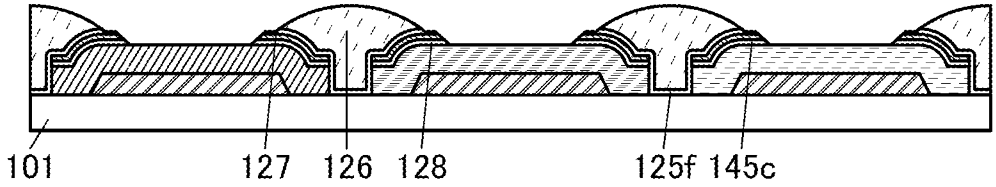
Figure 8C:
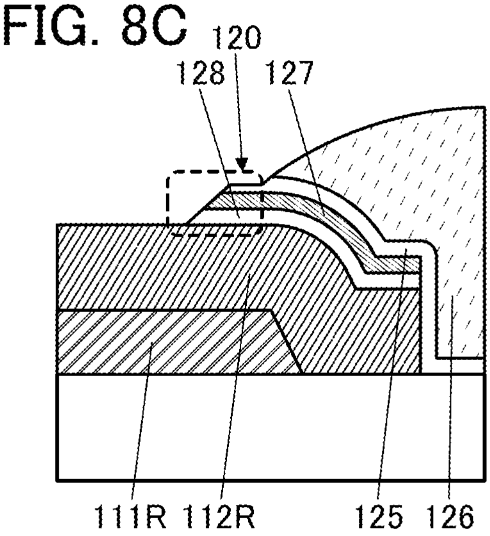

Next, part of the mask layer 145 remaining over the organic layer 112R is removed by wet etching to expose a top surface of the organic layer 112R (FIG. 7D and FIG. 8C). The mask layer 145 is processed, whereby the layer 128 is formed. At the etching of the mask layer 145, an exposed portion of the insulating layer 125 is partly etched to be thin as illustrated in FIG. 8C in some cases.

In the above manner, the projecting portion 120 can be completed.

Note that the insulating film 125*f*, the mask layer 147, and the mask layer 145 may be separately etched.

Figure 9A:
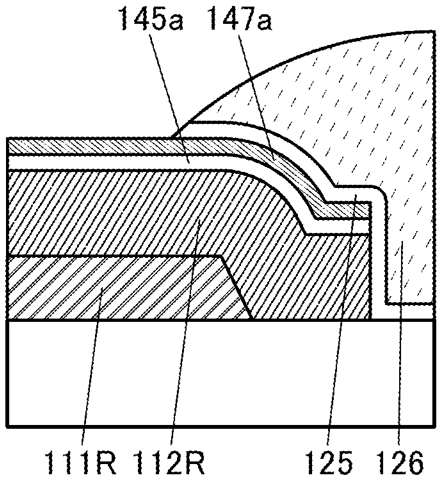
FIGS. 9A to 9D illustrate an example of a method of manufacturing a display device.

First, as illustrated in FIG. 9A, a portion of the insulating layer 125 not covered with the resin layer 126 is etched to expose a top surface of the mask layer 147.

Figure 9B:
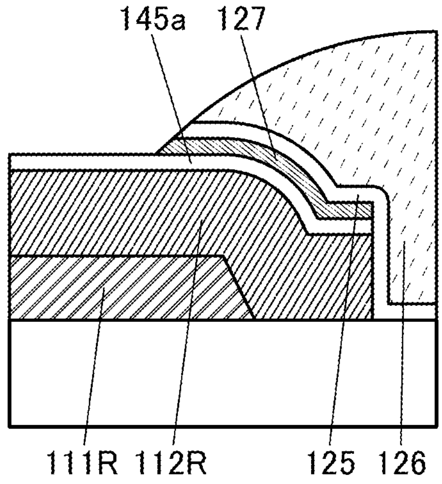

Next, as illustrated in FIG. 9B, a portion of the mask layer 147 not covered with the insulating layer 125 is etched to expose a top surface of the mask layer 145. The layer 147 is processed to form the layer 127.

Figure 9C:
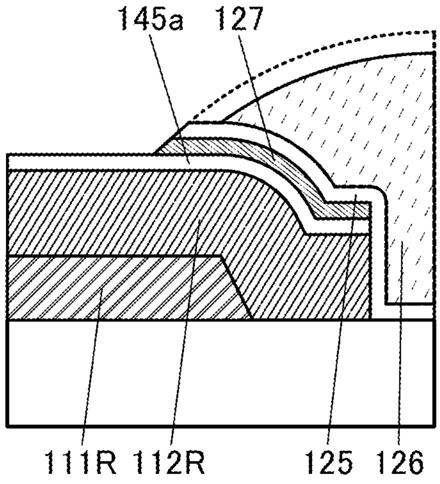

Then, as illustrated in FIG. 9C, the resin layer 126 is partly etched to be recessed. At this time, part of the top surface of the insulating layer 125 is exposed.

Figure 9D:
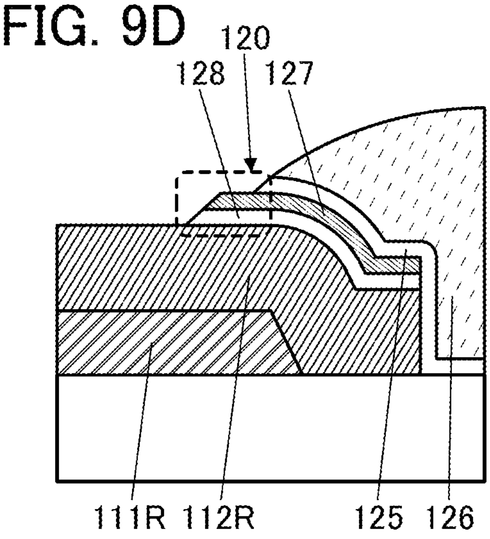

Finally, a portion of the mask layer 145 not covered with the layer 127 is partly etched to expose the organic layer 112 (FIG. 9D). The mask layer 145 is processed to form the layer 128. At this time, in the case where the same material film is used as the insulating layer 125 and the mask layer 145, the insulating layer 125 is also etched concurrently. Thus, as illustrated in FIG. 9D, part of the insulating layer 125 which covers the layer 127 is etched to expose part of the top surface of the layer 127 in some cases.

Figure 7E:
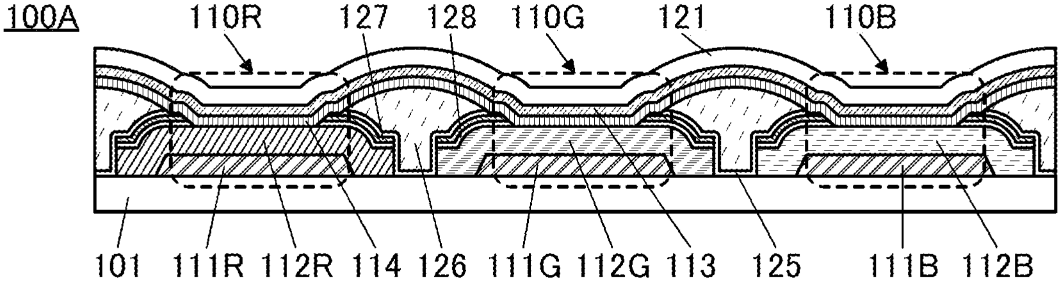

In the above manner, after the formation of the projecting portion 120, the common layer 114, the common electrode 113, and the protective layer 121 are formed as in Manufacturing method example 1 in the above, whereby the display device 100A can be manufactured (FIG. 7E).

The above is the description of Manufacturing method example 2.

[Pixel Layout]

Pixel layouts different from the layout in FIG. 1A will be mainly described below. There is no particular limitation on the arrangement of the light-emitting elements (subpixels), and a variety of methods can be employed.

Examples of a top surface shape of the subpixel include polygons such as a triangle, a tetragon (including a rectangle and a square), and a pentagon; polygons with rounded corners; an ellipse; and a circle. Here, a top surface shape of the subpixel corresponds to a top surface shape of a light-emitting region of the light-emitting element.

Figure 10A:
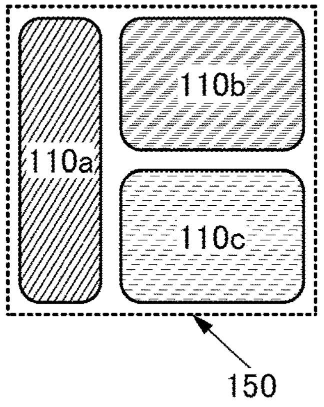
FIGS. 10A to 10F each illustrate a structure example of a pixel.

A pixel 150 illustrated in FIG. 10A employs S-stripe arrangement. The pixel 150 in FIG. 10A consists of three subpixels: light-emitting elements 110*a*, 110*b*, and 110*c*. For example, the light-emitting element 110*a* may be a blue-light-emitting element, the light-emitting element 110*b* may be a red-light-emitting element, and the light-emitting element 110*c* may be a green-light-emitting element.

Figure 10B:
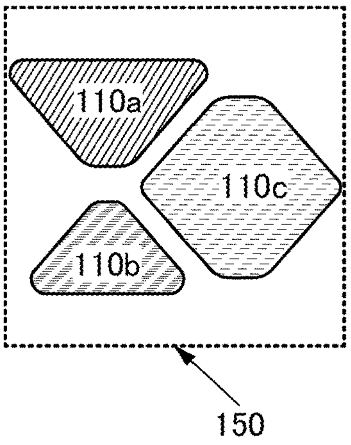

The pixel 150 illustrated in FIG. 10B includes the light-emitting element 110*a* whose top surface has a rough trapezoidal shape with rounded corners, the light-emitting element 110*b* whose top surface has a rough triangle shape with rounded corners, and the light-emitting element 110*c* whose top surface has a rough tetragonal or rough hexagonal shape with rounded corners. The light-emitting element 110*a* has a larger light-emitting area than the light-emitting element 110*b*. In this manner, the shapes and sizes of the light-emitting elements can be determined independently. For example, the size of a light-emitting element with higher reliability can be smaller. For example, the light-emitting element 110*a* may be a green-light-emitting element, the light-emitting element 110*b* may be a red-light-emitting element, and the light-emitting element 110*c* may be a blue-light-emitting element.

Figure 10C:
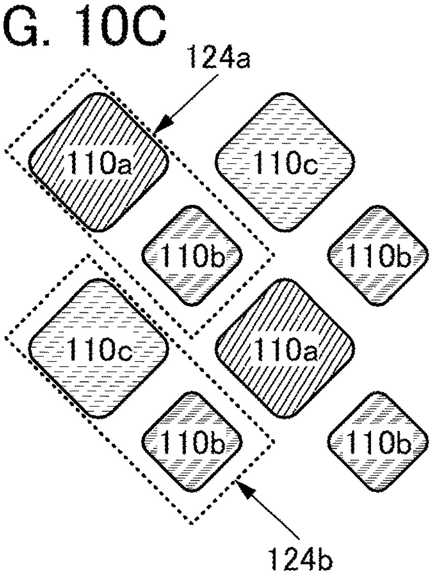

Pixels 124*a* and 124*b* illustrated in FIG. 10C employ PenTile arrangement. FIG. 10C illustrates an example in which the pixels 124*a* including the light-emitting elements 110*a* and 110*b* and the pixels 124*b* including the light-emitting elements 110*b* and 110*c* are alternately arranged. For example, the light-emitting element 110*a* may be a red-light-emitting element, the light-emitting element 110*b* may be a green-light-emitting element, and the light-emitting element 110*c* may be a blue-light-emitting element.

Figure 10D:
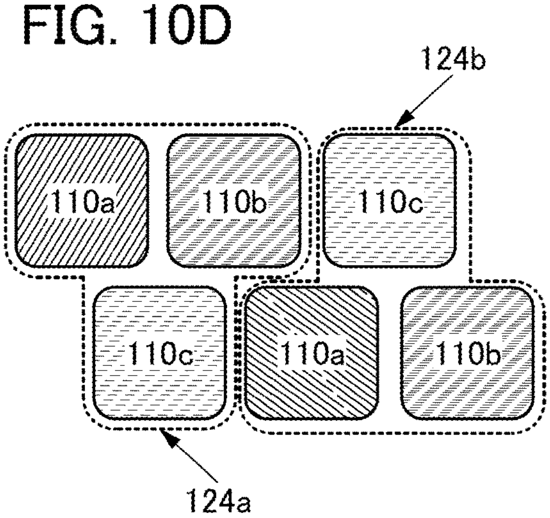
Figure 10E:
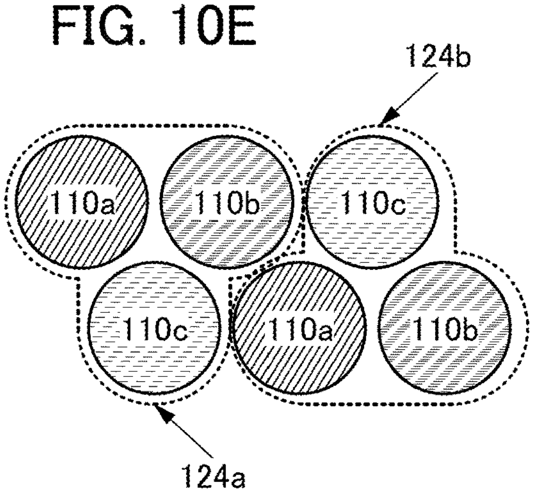

The pixels 124*a* and 124*b* illustrated in FIGS. 10D and 10E employ delta arrangement. The pixel 124*a* includes two light-emitting elements (the light-emitting elements 110*a* and 110*b*) in the upper row (first row) and one light-emitting element (the light-emitting element 110*c*) in the lower row (second row). The pixel 124*b* includes one light-emitting element (the light-emitting element 110*c*) in the upper row (first row) and two light-emitting elements (the light-emitting elements 110*a* and 110*b*) in the lower row (second row). For example, the light-emitting element 110*a* may be a red-light-emitting element, the light-emitting element 110$b$ may be a green-light-emitting element, and the light-emitting element 110$c$ may be a blue-light-emitting element.

FIG. 10D shows an example where the top surface of each light-emitting element has a rough tetragonal shape with rounded corners, and FIG. 10E shows an example where the top surface of each light-emitting element is circular.

Figure 10F:
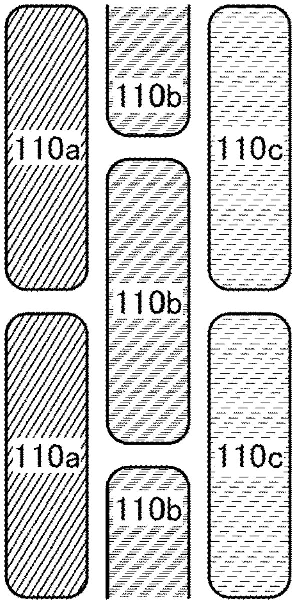

FIG. 10F shows an example where light-emitting elements of different colors are arranged in a zigzag manner. Specifically, the positions of the top sides of two light-emitting elements arranged in the column direction (e.g., the light-emitting element 110$a$ and the light-emitting element 110$b$ or the light-emitting element 110$b$ and the light-emitting element 110$c$) are not aligned in the top view. For example, the light-emitting element 110$a$ may be a red-light-emitting element, the light-emitting element 110$b$ may be a green-light-emitting element, and the light-emitting element 110$c$ may be a blue-light-emitting element.

In a photolithography method, as a pattern to be formed by processing becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, a top surface of a light-emitting element may have a polygonal shape with rounded corners, an elliptical shape, a circular shape, or the like.

Furthermore, in the manufacturing method of the display panel of one embodiment of the present invention, the EL layer is processed into an island shape with the use of a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape by processing. As a result, a top surface of the EL layer may have a polygonal shape with rounded corners, an elliptical shape, a circular shape, or the like. For example, when a resist mask with a square top surface is intended to be formed, a resist mask with a circular top surface may be formed, and the top surface of the EL layer may be circular.

To obtain a desired top surface shape of the EL layer, a technique of correcting a mask pattern in advance so that a transferred pattern agrees with a design pattern (an optical proximity correction (OPC) technique) may be used. Specifically, with the OPC technique, a pattern for correction is added to a corner portion or the like of a figure on a mask pattern.

The above is the description of the pixel layouts.

At least part of this embodiment can be implemented in combination with any of the other embodiments described in this specification, as appropriate.

Embodiment 2

In this embodiment, structure examples of a display device of one embodiment of the present invention will be described.

The display device of this embodiment can be used for display portions of electronic devices such as a digital camera, a digital video camera, a digital photo frame, a mobile phone, a portable game console, a smart phone, a wristwatch terminal, a tablet terminal, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Device 400]

Figure 11:
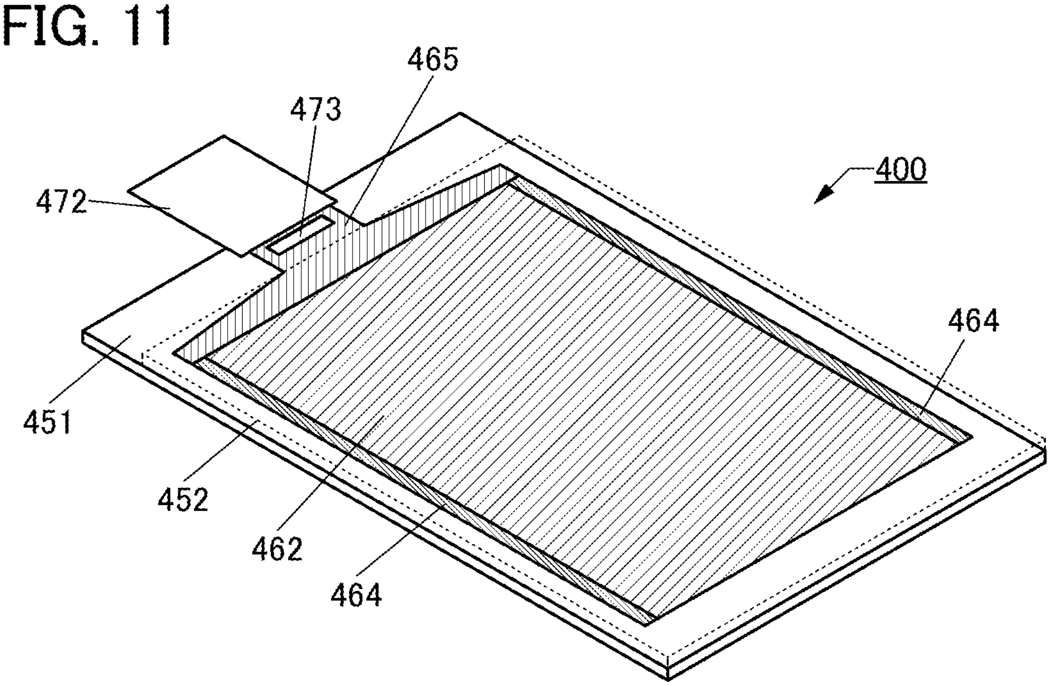
FIG. 11 illustrates a structure example of a display device.
Figure 12A:
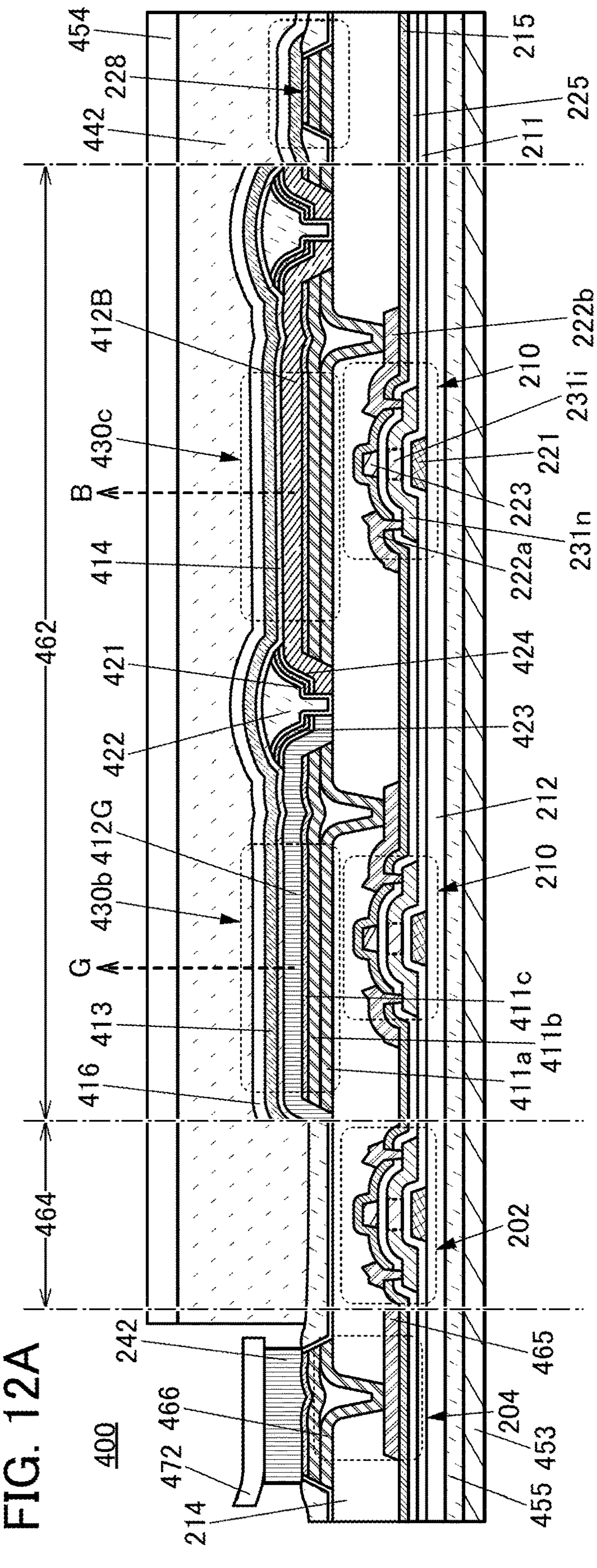
FIGS. 12A and 12B illustrate a structure example of a display device.

FIG. 11 is a perspective view of a display device 400, and FIG. 12A is a cross-sectional view of the display device 400.

The display device 400 has a structure where a substrate 452 and a substrate 451 are bonded to each other. In FIG. 11, the substrate 452 is denoted by a dashed line.

The display device 400 includes a display portion 462, a circuit 464, a wiring 465, and the like. FIG. 11 illustrates an example in which an IC 473 and an FPC 472 are implemented on the display device 400. Thus, the structure illustrated in FIG. 11 can be regarded as a display module including the display device 400, the IC (integrated circuit), and the FPC.

As the circuit 464, a scan line driver circuit can be used, for example.

The wiring 465 has a function of supplying a signal and power to the display portion 462 and the circuit 464. The signal and power are input to the wiring 465 from the outside through the FPC 472 or from the IC 473.

FIG. 11 illustrates an example in which the IC 473 is provided over the substrate 451 by a chip on glass (COG) method, a chip on film (COF) method, or the like. An IC including a scan line driver circuit, a signal line driver circuit, or the like can be used as the IC 473, for example. Note that the display device 400 and the display module are not necessarily provided with an IC. The IC may be mounted on the FPC by a COF method or the like.

FIG. 12A illustrates an example of cross sections of part of a region including the FPC 472, part of the circuit 464, part of the display portion 462, and part of a region including a connection portion of the display device 400. FIG. 12A specifically illustrates an example of a cross section of a region including a light-emitting element 430$b$, which emits green light, and a light-emitting element 430$c$, which emits blue light, in the display portion 462.

The display device 400 illustrated in FIG. 12A includes a transistor 202, a transistor 210, the light-emitting element 430$b$, the light-emitting element 430$c$, and the like between a substrate 453 and a substrate 454.

The light-emitting element described in Embodiment 1 can be employed for the light-emitting element 430$b$ and the light-emitting element 430$c$.

In the case where a pixel of the display device includes three kinds of subpixels including light-emitting elements emitting different colors from each other, the three subpixels can be of three colors of red (R), green (G), and blue (B) or of three colors of yellow (Y), cyan (C), and magenta (M). In the case where four subpixels are included, the four subpixels can be of four colors of R, G, B, and white (W) or of four colors of R, G, B, and Y.

The substrate 454 and a protective layer 416 are bonded to each other with an adhesive layer 442. The adhesive layer 442 is provided so as to overlap with the light-emitting element 430$b$ and the light-emitting element 430$c$; that is, the display device 400 employs a solid sealing structure.

The light-emitting element 430$b$ and the light-emitting element 430$c$ each include a conductive layer 411$a$, a conductive layer 411$b$, and a conductive layer 411$c$ as a pixel electrode. The conductive layer 411$b$ reflects visible light and functions as a reflective electrode. The conductive layer 411$c$ transmits visible light and functions as an optical adjustment layer.

The conductive layer 411*a* is connected to a conductive layer 222*b* included in the transistor 210 through an opening provided in an insulating layer 214. The transistor 210 has a function of controlling the driving of the light-emitting element.

An EL layer 412G or an EL layer 412B is provided to cover the pixel electrode. An insulating layer 421 is provided in contact with a side surface of the EL layer 412G and a side surface of the EL layer 412B, and a resin layer 422 is provided to fill a recessed portion of the insulating layer 421. A layer 423 is provided between the EL layer 412G and the insulating layer 421 and a layer 424 is provided between the EL layer 412B and the insulating layer 421. A common layer 414, a common electrode 413, and the protective layer 416 are provided to cover the EL layer 412G and the EL layer 412B.

Light from the light-emitting element is emitted toward the substrate 452. For the substrate 452, a material having a high visible-light-transmitting property is preferably used.

The transistor 202 and the transistor 210 are formed over the substrate 451. These transistors can be fabricated using the same materials in the same steps.

The substrate 453 and an insulating layer 212 are bonded to each other with an adhesive layer 455.

As a method for manufacturing the display device 400, first, a formation substrate provided with the insulating layer 212, the transistors, the light-emitting elements, and the like is bonded to the substrate 454 with the adhesive layer 442. Then, the substrate 453 is bonded to a surface exposed by separation of the formation substrate, whereby the components formed over the formation substrate are transferred onto the substrate 453. The substrate 453 and the substrate 454 are preferably flexible. Accordingly, the display device 400 can be highly flexible.

The inorganic insulating film that can be used as an insulating layer 211 and an insulating layer 215 can be used as the insulating layer 212.

A connection portion 204 is provided in a region of the substrate 453 that is not overlapped by the substrate 454. In the connection portion 204, the wiring 465 is electrically connected to the FPC 472 through a conductive layer 466 and a connection layer 242. The conductive layer 466 can be obtained by processing the same conductive film as the pixel electrode. Thus, the connection portion 204 and the FPC 472 can be electrically connected to each other through the connection layer 242.

The transistor 202 and the transistor 210 each include a conductive layer 221 functioning as a gate, the insulating layer 211 functioning as a gate insulating layer, a semiconductor layer 231 including a channel formation region 231*i* and a pair of low-resistance regions 231*n*, a conductive layer 222*a* connected to one of the low-resistance regions 231*n*, the conductive layer 222*b* connected to the other low-resistance region 231*n*, an insulating layer 225 functioning as a gate insulating layer, a conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are connected to the corresponding low-resistance regions 231*n* through openings provided in the insulating layer 215. One of the conductive layers 222*a* and 222*b* functions as a source, and the other functions as a drain.

FIG. 12A shows an example where the insulating layer 225 covers a top and side surfaces of the semiconductor layer. The conductive layer 222*a* and the conductive layer 222*b* are connected to the corresponding low-resistance regions 231*n* through openings provided in the insulating layer 225 and the insulating layer 215.

Figure 12B:
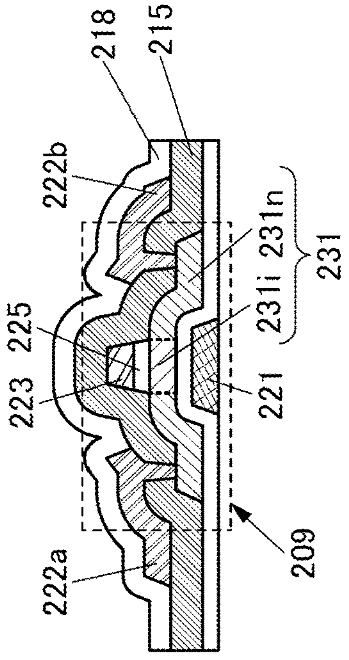

In a transistor 209 illustrated in FIG. 12B, the insulating layer 225 overlaps with the channel formation region 231*i* of the semiconductor layer 231 and does not overlap with the low-resistance regions 231*n*. The structure illustrated in FIG. 12B is obtained by processing the insulating layer 225 with the conductive layer 223 as a mask, for example. In FIG. 12B, the insulating layer 215 is provided to cover the insulating layer 225 and the conductive layer 223, and the conductive layer 222*a* and the conductive layer 222*b* are connected to the low-resistance regions 231*n* through the openings in the insulating layer 215. Furthermore, an insulating layer 218 covering the transistor may be provided.

There is no particular limitation on the structure of the transistors included in the display device of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The structure in which the semiconductor layer where a channel is formed is provided between two gates is used for the transistors 202 and 210. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used in the semiconductor layer of the transistor, and an amorphous semiconductor, a single crystal semiconductor, or a semiconductor having crystallinity other than single crystal (a microcrystalline semiconductor, a polycrystalline semiconductor, or a semiconductor partly including crystal regions) can be used. It is preferable to use a single crystal semiconductor or a semiconductor having crystallinity, in which case deterioration of the transistor characteristics can be inhibited.

It is preferable that a semiconductor layer of a transistor contain metal oxide (also referred to as an oxide semiconductor). That is, a transistor including metal oxide in its channel formation region (hereinafter, also referred to as an OS transistor) is preferably used for the display device of this embodiment.

The band gap of metal oxide included in the semiconductor layer of the transistor is preferably 2 eV or more, further preferably 2.5 eV or more. The use of such metal oxide having a wide band gap can reduce the off-state current of the OS transistor.

Metal oxide preferably contains at least indium or zinc, and further preferably contains indium and zinc. Metal oxide preferably contains indium, M (M is one or more of gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example.

Alternatively, a semiconductor layer of a transistor may contain silicon. Examples of silicon include amorphous silicon and crystalline silicon (e.g., low-temperature polysilicon or single crystal silicon).

The transistor included in the circuit 464 and the transistor included in the display portion 462 may have the same structure or different structures. One structure or two or more kinds of structures may be employed for a plurality of transistors included in the circuit 464. Similarly, one structure or two or more kinds of structures may be employed for a plurality of transistors included in the display portion 462.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of a display device.

An inorganic insulating film is preferably used as each of the insulating layers 211, 212, 215, 218, and 225. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above inorganic insulating films may also be used.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

A variety of optical members can be arranged on the inner or outer surface of the substrate 454. Examples of the optical members include a light-blocking layer, a polarizing plate, a retardation plate, a light diffusion layer (e.g., a diffusion film), an anti-reflective layer, a microlens array, and a light-condensing film. Furthermore, an antistatic film inhibiting the attachment of dust, a water repellent film suppressing the attachment of stain, a hard coat film inhibiting generation of a scratch caused by the use, an impact-absorbing layer, or the like may be arranged on the outer surface of the substrate 454.

When the protective layer 416 covering the light-emitting element is provided, which inhibits an impurity such as water from entering the light-emitting element. As a result, the reliability of the light-emitting element can be enhanced.

FIG. 12A illustrates a connection portion 228. In the connection portion 228, the common electrode 413 is electrically connected to a wiring. FIG. 12A illustrates an example in which the wiring has the same stacked-layer structure as the pixel electrode.

For each of the substrates 453 and 454, glass, quartz, ceramic, sapphire, a resin, a metal, an alloy, a semiconductor, or the like can be used. The substrate on the side from which light from the light-emitting element is extracted is formed using a material that transmits the light. When the substrates 453 and 454 are formed using a flexible material, the flexibility of the display device can be increased. Furthermore, a polarizing plate may be used as the substrate 453 or the substrate 454.

For each of the substrates 453 and 454, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrates 453 and 454.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

As materials for the gates, the source, and the drain of a transistor and conductive layers functioning as wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

As a light-transmitting conductive material, conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. They can also be used for conductive layers such as wirings and electrodes included in the display device, and conductive layers (e.g., a conductive layer functioning as a pixel electrode or a common electrode) included in a light-emitting element.

Examples of insulating materials that can be used for the insulating layers include a resin such as an acrylic resin and an epoxy resin, and an inorganic insulating material such as silicon oxide, silicon oxynitride, silicon nitride oxide, silicon nitride, and aluminum oxide.

At least part of this embodiment can be implemented in combination with any of the other embodiments described in this specification, as appropriate.

Embodiment 3

In this embodiment, the display panel of one embodiment of the present invention will be described with reference to drawings.

The display panel of this embodiment can be a high-resolution display panel. Thus, the display device of one embodiment of the present invention can be used for display portions of information terminals (wearable devices) such as watch-type or bracelet-type information terminals and display portions of wearable devices capable of being worn on a head, such as a VR device such as a head-mounted display and a glasses-type AR device.

[Display Module]

Figure 13A:
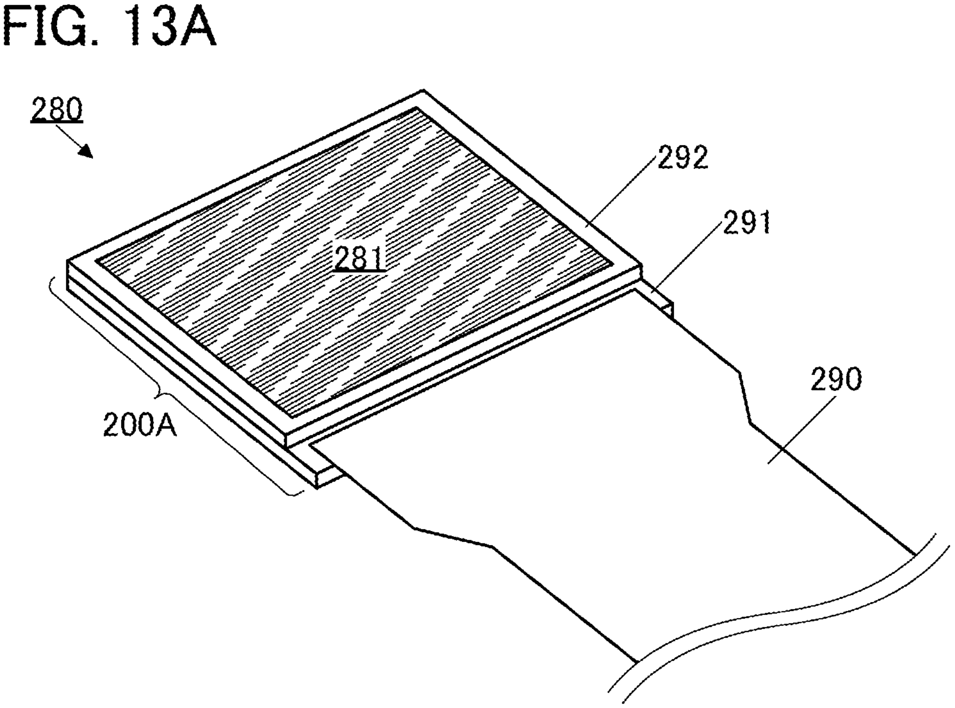
FIGS. 13A and 13B illustrate structure examples of a display device.

FIG. 13A is a perspective view of a display module 280. The display module 280 includes a display device 200A and an FPC 290. Note that a display panel included in the display module 280 is not limited to the display device 200A, and may be any of display devices 200B to 200F, which are described later.

The display module 280 includes a substrate 291 and a substrate 292. The display module 280 includes a display portion 281. The display portion 281 is a region where an image is displayed.

Figure 13B:
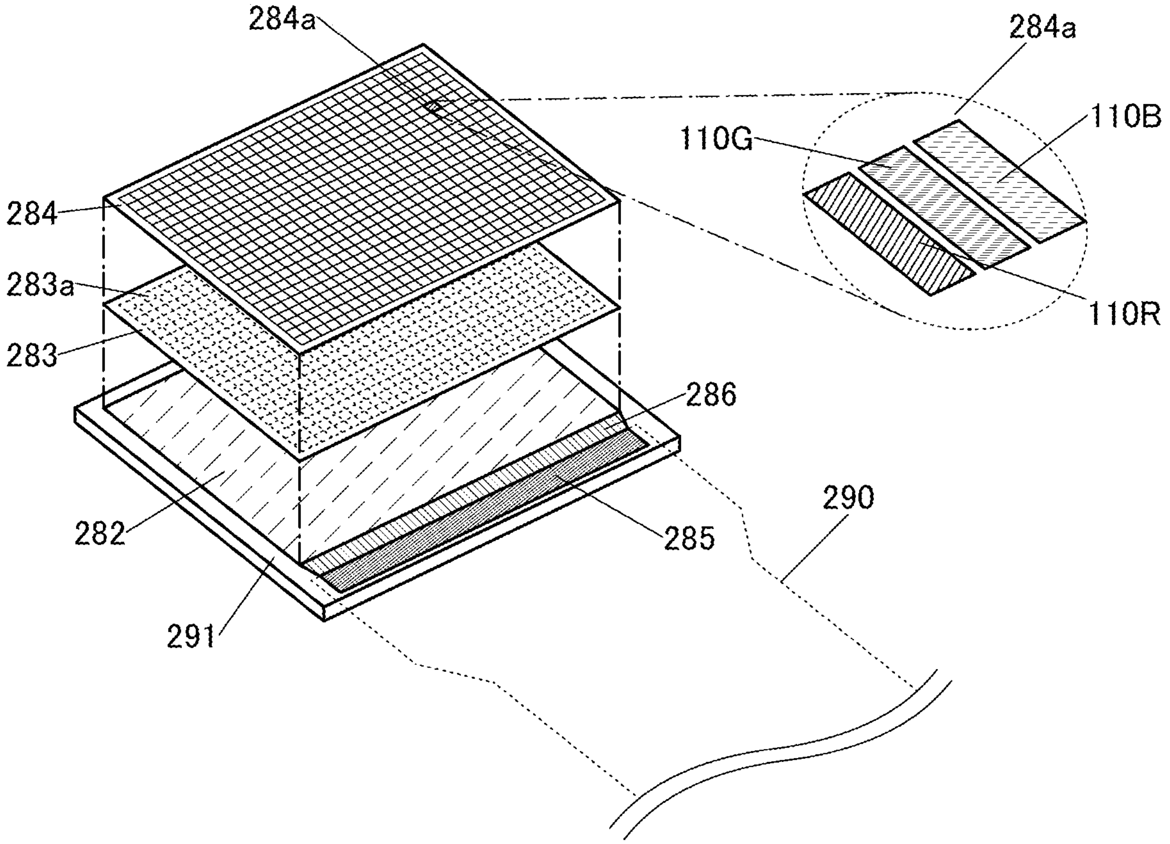

FIG. 13B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. In addition, a terminal portion 285 for connection to the FPC 290 is included in a portion not overlapping with the pixel portion 284 over the substrate 291. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side in FIG. 13B. The pixel 284*a* includes the light-emitting element 110R emitting red light, the light-emitting element 110G emitting green light, and the light-emitting element 110B emitting blue light.

The pixel circuit portion 283 includes a plurality of pixel circuits 283*a* arranged periodically. One pixel circuit 283*a* is a circuit that controls light emission from three light-emitting devices included in one pixel 284*a*. One pixel circuit 283*a* may be provided with three circuits each of which controls light emission of one light-emitting device. For example, the pixel circuit 283*a* can include at least one selection transistor, one current control transistor (driving transistor), and a capacitor for one light-emitting device. In this case, a gate signal is input to a gate of the selection transistor, and a source signal is input to a source of the selection transistor. Thus, an active-matrix display panel is achieved.

The circuit portion 282 includes a circuit for driving the pixel circuits 283*a* in the pixel circuit portion 283. For example, one or both of a gate line driver circuit and a source line driver circuit are preferably included. In addition, at least one of an arithmetic circuit, a memory circuit, a power supply circuit, and the like may be included. A transistor included in the circuit portion 282 may constitute part of the pixel circuit 283*a*. That is, the pixel circuit 283*a* may be constituted by a transistor included in the pixel circuit portion 283 and a transistor included in the circuit portion 282.

The FPC 290 functions as a wiring for supplying a video signal, a power supply potential, and the like to the circuit portion 282 from the outside. An IC may be mounted on the FPC 290.

The display module 280 can have a structure in which one or both of the pixel circuit portion 283 and the circuit portion 282 are stacked below the pixel portion 284; thus, the aperture ratio (the effective display area ratio) of the display portion 281 can be significantly high. For example, the aperture ratio of the display portion 281 can be greater than or equal to 40% and less than 100%, preferably greater than or equal to 50% and less than or equal to 95%, and further preferably greater than or equal to 60% and less than or equal to 95%. Furthermore, the pixels 284*a* can be arranged extremely densely and thus the display portion 281 can have greatly high resolution. For example, the pixels 284*a* are preferably arranged in the display portion 281 with a resolution greater than or equal to 2000 ppi, preferably greater than or equal to 3000 ppi, further preferably greater than or equal to 5000 ppi, and still further preferably greater than or equal to 6000 ppi, and less than or equal to 20000 ppi or less than or equal to 30000 ppi.

Such a display module 280 has extremely high resolution, and thus can be suitably used for a device for VR such as a head-mounted display or a glasses-type device for AR. For example, even in the case of a structure in which the display portion of the display module 280 is seen through a lens, pixels of the extremely-high-resolution display portion 281 included in the display module 280 are prevented from being seen when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a wrist watch.

[Display Device 200A]

Figure 14:
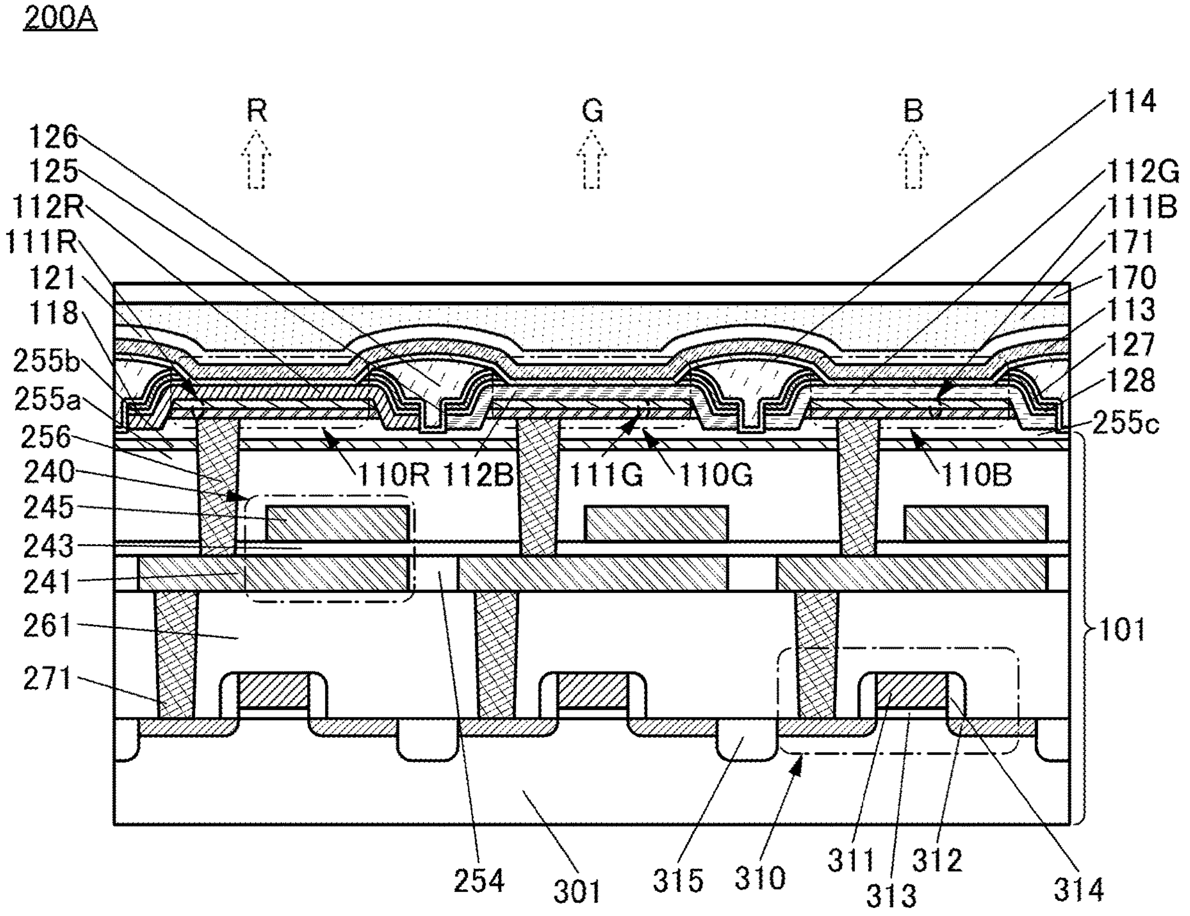
FIG. 14 illustrates a structure example of a display device.

The display device 200A illustrated in FIG. 14 includes a substrate 301, the light-emitting elements 110R, 110G, and 110B, a capacitor 240, and a transistor 310.

The substrate 301 corresponds to the substrate 291 in FIGS. 13A and 13B.

The transistor 310 is a transistor whose channel formation region is in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover a side surface of the conductive layer 311.

An element isolation layer 315 is provided between two adjacent transistors 310 so as to be embedded in the substrate 301.

Furthermore, an insulating layer 261 is provided to cover the transistor 310, and the capacitor 240 is provided over the insulating layer 261.

The capacitor 240 includes a conductive layer 241, a conductive layer 245, and an insulating layer 243 between the conductive layers 241 and 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255*a* is provided to cover the capacitor 240; an insulating layer 255*b* is provided over the insulating layer 255*a*; and an insulating layer 255*c* is provided over the insulating layer 255*b*.

An inorganic insulating film can be suitably used as each of the insulating layers 255*a*, 255*b*, and 255*c*. For example, it is preferable that a silicon oxide film be used as the insulating layers 255*a* and 255*c* and a silicon nitride film be used as the insulating layer 255*b*. This enables the insulating layer 255*b* to function as an etching protective film. Although this embodiment shows an example in which part of the insulating layer 255*c* is etched to form a recessed portion, the recessed portion is not necessarily provided in the insulating layer 255*c*.

The light-emitting element 110R, the light-emitting element 110G, and the light-emitting element 110B are provided over the insulating layer 255*c*. Embodiment 1 can be referred to for the structures of the light-emitting element 110R, the light-emitting element 110G, and the light-emitting element 110B.

In the display device 200A, since the light-emitting devices of different colors are separately formed, the difference between the chromaticity at low luminance emission and that at high luminance emission is small. Furthermore, since the organic layers 112R, 112G, and 112B are separated from each other, crosstalk generated between adjacent subpixels can be prevented while the display device 200A has high resolution. Accordingly, the display panel can have high resolution and high display quality.

In the region between adjacent light-emitting elements, the insulating layer 125, the resin layer 126, the layer 127, and the layer 128 are provided.

The pixel electrodes 111R, 111G, and 111B of the light-emitting elements are each electrically connected to one of the source and the drain of the transistor 310 through a plug 256 embedded in the insulating layers 255*a*, 255*b*, and 255*c*, the conductive layer 241 embedded in the insulating layer 254, and the plug 271 embedded in the insulating layer 261. A top surface of the insulating layer 255*c* and a top surface of the plug 256 are level with or substantially level with each other. Any of a variety of conductive materials can be used for the plugs.

The protective layer 121 is provided over the light-emitting elements 110R, 110G, and 110B. A substrate 170 is bonded above the protective layer 121 with an adhesive layer 171.

An insulating layer covering an end portion of a top end portion of the pixel electrode 111 is not provided between two adjacent pixel electrodes 111. Thus, the interval between adjacent light-emitting elements can be extremely shortened. Accordingly, the display device can have high resolution or high definition.

[Display Device 200B]

Figure 15:
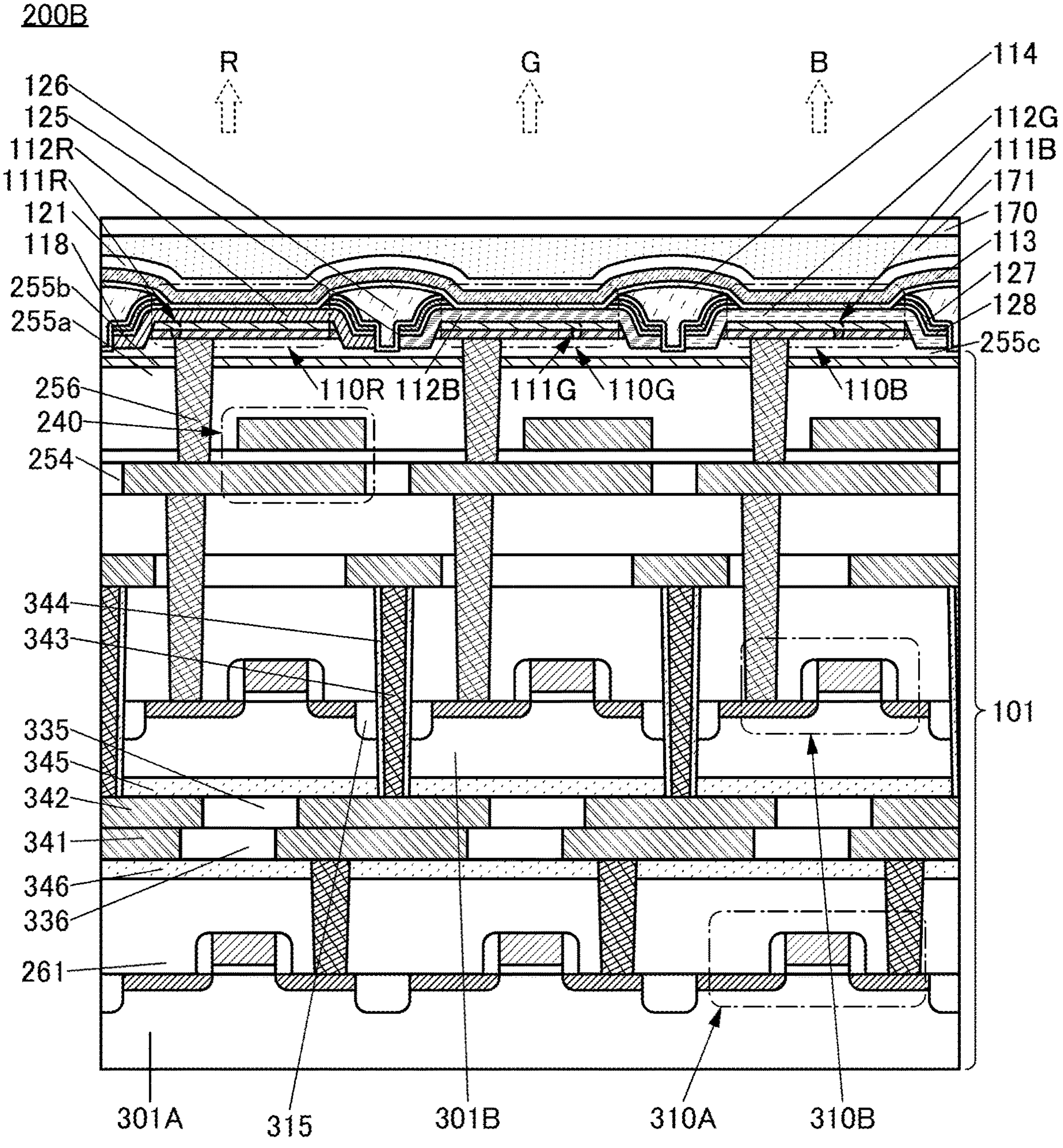
FIG. 15 illustrates a structure example of a display device.

The display device 200B illustrated in FIG. 15 has a structure in which a transistor 310A and a transistor 310B each having a channel formed in a semiconductor substrate are stacked. Note that in the following description of display panels, the description of portions similar to those of the above-described display panel may be omitted.

In the display device 200B, a substrate 301B provided with the transistor 310B, the capacitor 240, and the light-emitting devices is bonded to a substrate 301A provided with the transistor 310A.

Here, an insulating layer 345 is provided on a bottom surface of the substrate 301B. An insulating layer 346 is provided over the insulating layer 261 over the substrate 301A. The insulating layers 345 and 346 function as protective layers and can inhibit diffusion of impurities into the substrate 301B and the substrate 301A. As the insulating layers 345 and 346, an inorganic insulating film that can be used as the protective layer 121 or an insulating layer 332 can be used.

The substrate 301B is provided with a plug 343 that penetrates the substrate 301B and the insulating layer 345. An insulating layer 344 functioning as a protective layer is preferably provided to cover a side surface of the plug 343.

A conductive layer 342 is provided under the insulating layer 345 on the rear surface of the substrate 301B. The conductive layer 342 is embedded in the insulating layer 335. Bottom surfaces of the conductive layer 342 and the insulating layer 335 are planarized. The conductive layer 342 is electrically connected to the plug 343.

A conductive layer 341 is provided over the insulating layer 346 over the substrate 301A. The conductive layer 341 is embedded in the insulating layer 336. Top surfaces of the conductive layer 341 and the insulating layer 336 are planarized.

The conductive layers 341 and 342 are preferably formed using the same conductive material. For example, it is possible to use a metal film containing an element selected from Al, Cr, Cu, Ta, Ti, Mo, and W, or a metal nitride film containing any of the above elements as a component (a titanium nitride film, a molybdenum nitride film, or a tungsten nitride film). Copper is particularly preferably used for the conductive layers 341 and 342. In that case, it is possible to employ copper-to-copper (Cu-to-Cu) direct bonding (a technique for achieving electrical continuity by connecting copper (Cu) pads).

[Display Device 200C]

Figure 16:
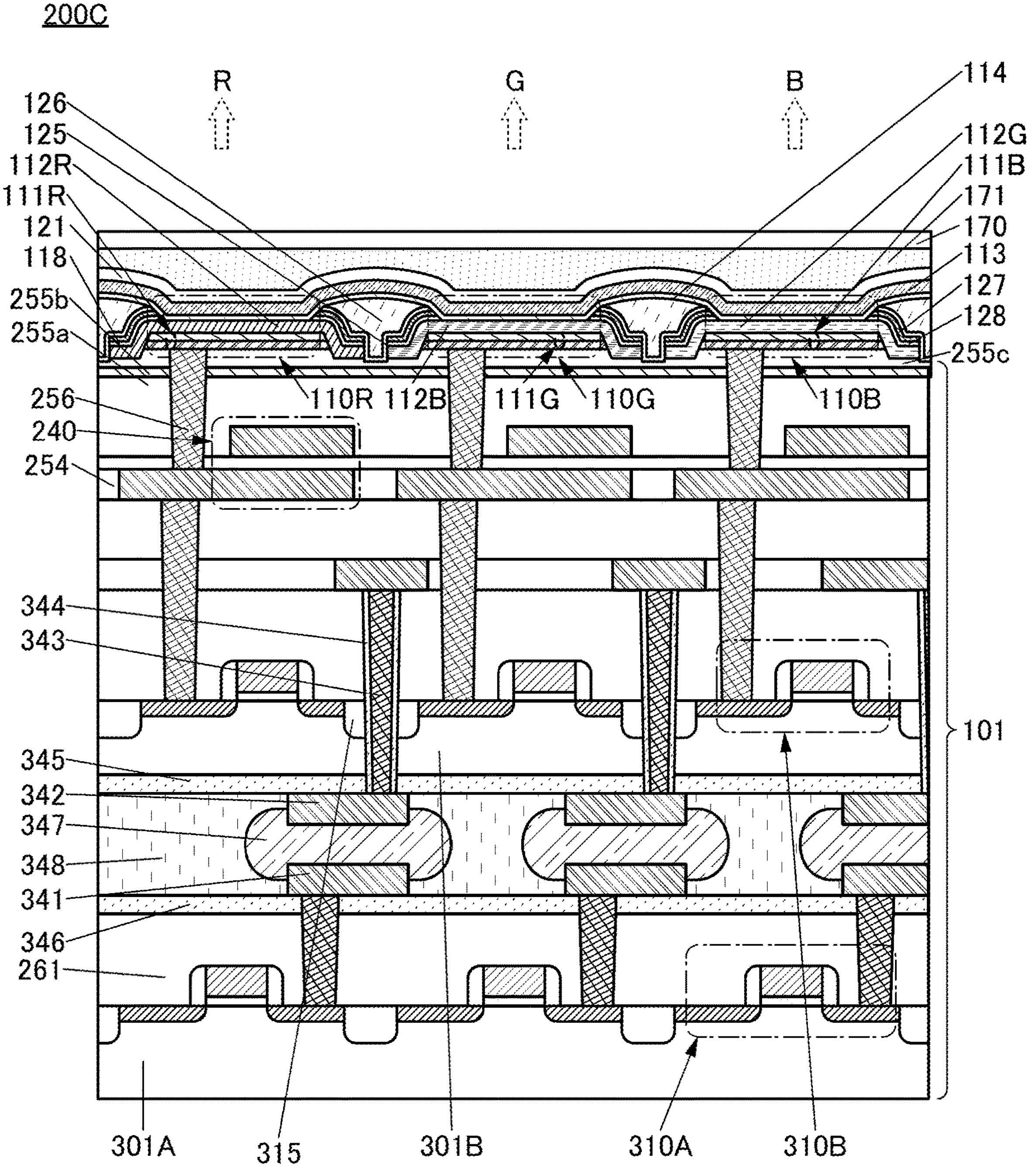
FIG. 16 illustrates a structure example of a display device.

The display device 200C illustrated in FIG. 16 has a structure in which the conductive layer 341 and the conductive layer 342 are bonded to each other with a bump 347.

As illustrated in FIG. 16, providing the bump 347 between the conductive layer 341 and the conductive layer 342 enables the conductive layers 341 and 342 to be electrically connected to each other. The bump 347 can be formed using a conductive material containing gold (Au), nickel (Ni), indium (In), tin (Sn), or the like, for example. As another example, solder may be used for the bump 347. An adhesive layer 348 may be provided between the insulating layer 345 and the insulating layer 346. In the case where the bump 347 is provided, the insulating layer 335 and the insulating layer 336 may be omitted.

[Display Device 200D]

Figure 17:
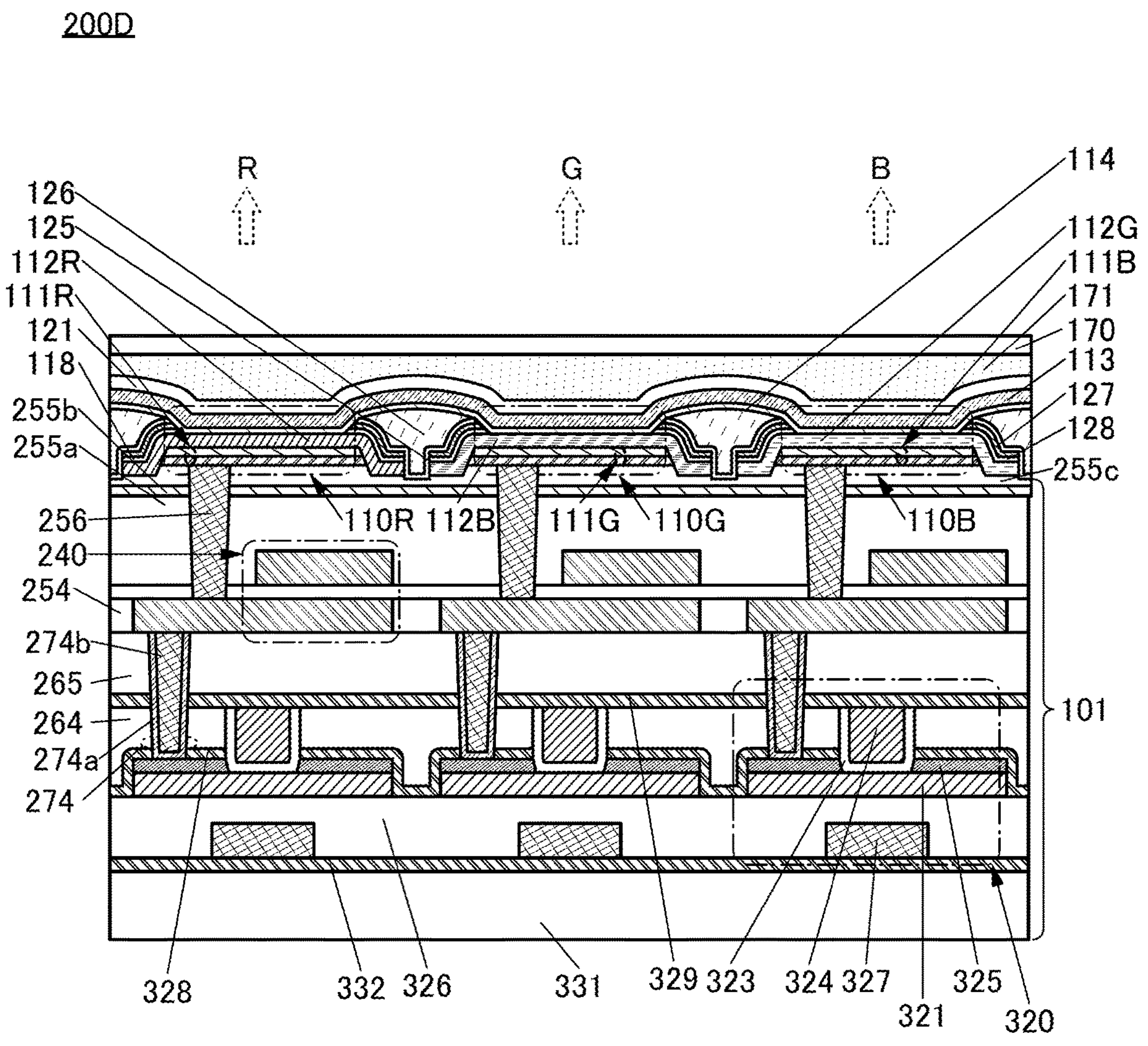
FIG. 17 illustrates a structure example of a display device.

The display device 200D illustrated in FIG. 17 differs from the display device 200A mainly in a structure of a transistor.

A transistor 320 is a transistor that contains metal oxide (also referred to as an oxide semiconductor) in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 illustrated in FIGS. 13A and 13B.

The insulating layer 332 is provided over the substrate 331. The insulating layer 332 functions as a barrier layer that prevents diffusion of an impurity such as water or hydrogen from the substrate 331 into the transistor 320 and release of oxygen from the semiconductor layer 321 to the insulating layer 332 side. As the insulating layer 332, it is possible to use, for example, a film in which hydrogen or oxygen is less likely to diffuse than in a silicon oxide film, such as an aluminum oxide film, a hafnium oxide film, or a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. A top surface of the insulating layer 326 is preferably planarized.

The semiconductor layer 321 is provided over the insulating layer 326. A metal oxide film having semiconductor characteristics (also referred to as an oxide semiconductor film) is preferably used as the semiconductor layer 321. The pair of conductive layers 325 are provided on and in contact with the semiconductor layer 321, and function as a source electrode and a drain electrode.

An insulating layer 328 is provided to cover top and side surfaces of the pair of conductive layers 325, a side surface of the semiconductor layer 321, and the like, and an insulating layer 264 is provided over the insulating layer 328. The insulating layer 328 functions as a barrier layer that prevents diffusion of an impurity such as water or hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layers 328 and 264. The insulating layer 323 that is in contact with a top surface of the semiconductor layer 321 and the conductive layer 324 are embedded in the opening. The conductive layer 324 functions as a second gate electrode, and the insulating layer 323 functions as a second gate insulating layer.

A top surface of the conductive layer 324, a top surface of the insulating layer 323, and a top surface of the insulating layer 264 are planarized so that they are level with or substantially level with each other, and an insulating layer 329 and an insulating layer 265 are provided to cover these layers.

The insulating layers 264 and 265 each function as an interlayer insulating layer. The insulating layer 329 functions as a barrier layer that prevents diffusion of an impurity such as water or hydrogen from the insulating layer 265 or the like into the transistor 320. As the insulating layer 329, an insulating film similar to the insulating layers 328 and 332 can be used.

A plug 274 electrically connected to one of the pair of conductive layers 325 is provided to be embedded in the insulating layers 265, 329, and 264. Here, the plug 274 preferably includes a conductive layer 274*a* that covers a side surface of an opening formed in the insulating layers 265, 329, 264, and 328 and part of the top surface of the conductive layer 325, and a conductive layer 274*b* in contact with a top surface of the conductive layer 274*a*. For the conductive layer 274*a*, a conductive material in which hydrogen and oxygen are less likely to diffuse is preferably used.

[Display Device 200E]

Figure 18:
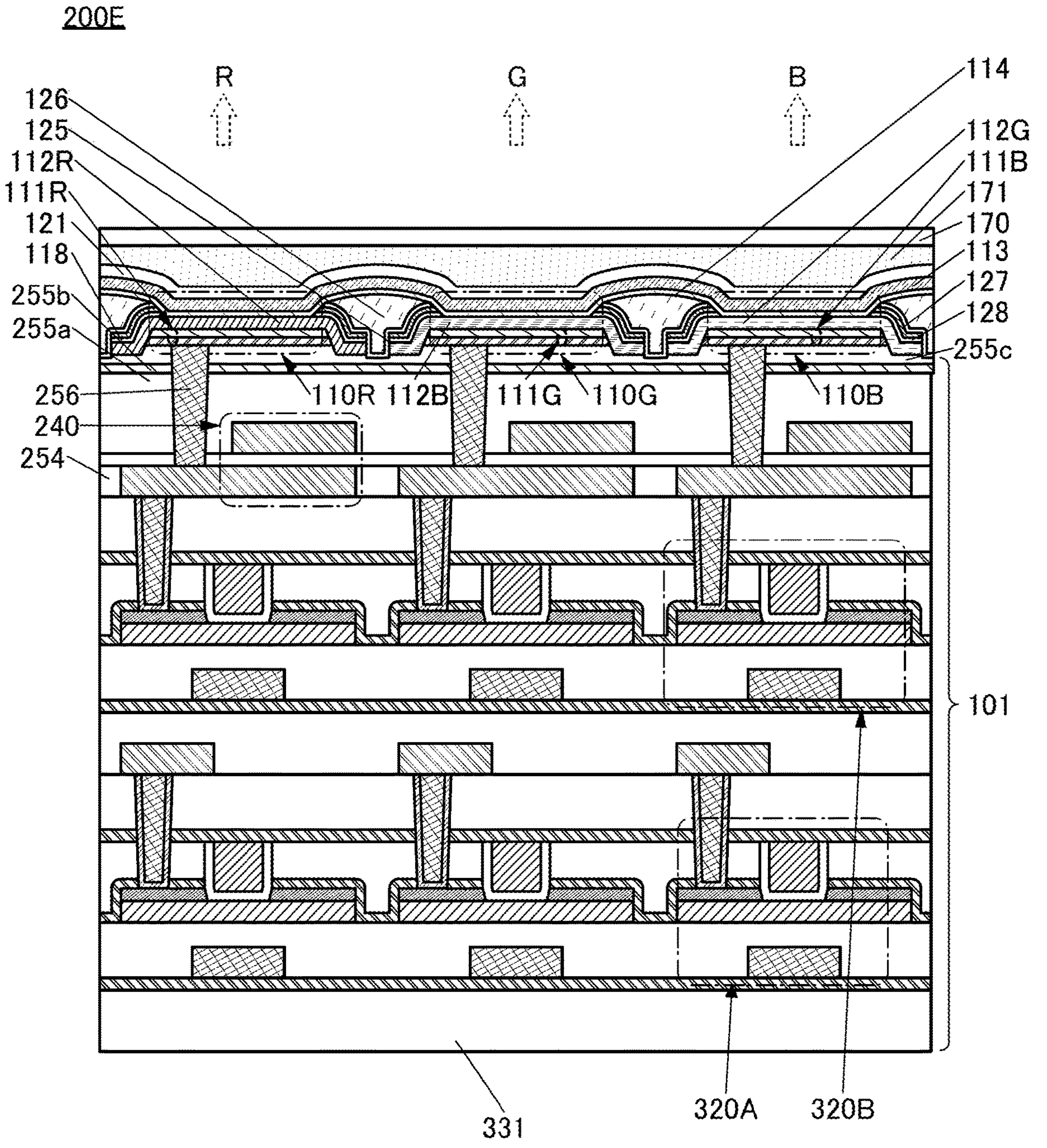
FIG. 18 illustrates a structure example of a display device.

The display device 200E illustrated in FIG. 18 has a structure in which a transistor 320A and a transistor 320B each including an oxide semiconductor in a semiconductor where a channel is formed are stacked.

The description of the display device 200D can be referred to for the transistor 320A, the transistor 320B, and the components around them.

Although the structure in which two transistors each including an oxide semiconductor are stacked is described, one embodiment of the present invention is not limited thereto. For example, three or more transistors may be stacked.

[Display Device 200F]

Figure 19:
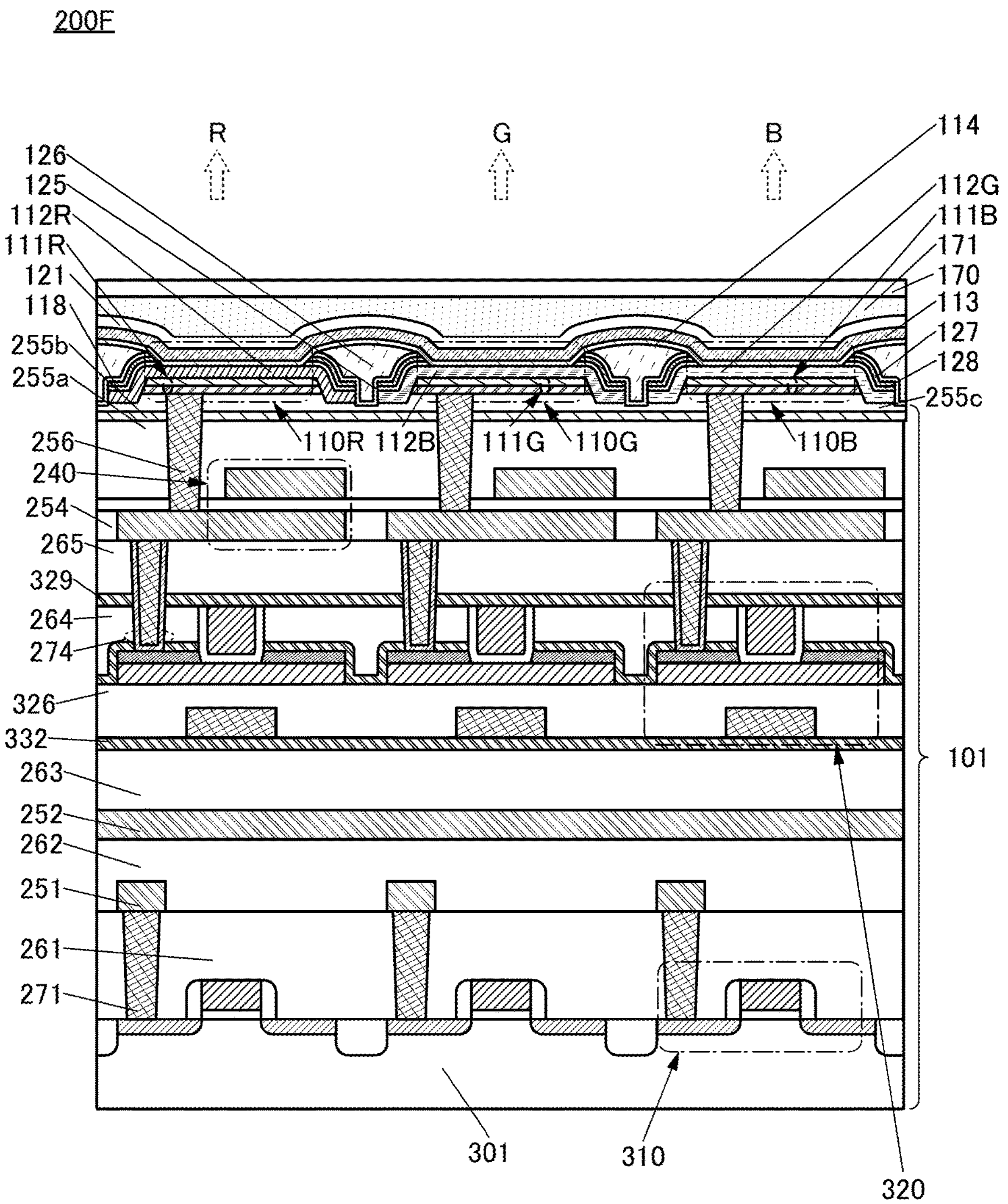
FIG. 19 illustrates a structure example of a display device.

The display device 200F illustrated in FIG. 19 has a structure in which the transistor 310 having a channel formed in the substrate 301 and the transistor 320 including metal oxide in a semiconductor layer where a channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display panel can be downsized as compared with the case where a driver circuit is provided around a display region.

At least part of this embodiment can be implemented in combination with any of the other embodiments described in this specification, as appropriate.

Embodiment 4

In this embodiment, a light-emitting element (also referred to as light-emitting device) that can be used in the display device of one embodiment of the present invention will be described.

In this specification and the like, a structure in which light-emitting layers in light-emitting devices of different colors (here, blue (B), green (G), and red (R)) are separately formed or separately patterned may be referred to as a side-by-side (SBS) structure. In this specification and the like, a light-emitting device capable of emitting white light may be referred to as a white light-emitting device. Note that a combination of white light-emitting devices with coloring layers (e.g., color filters) enables a full-color display device.

[Light-Emitting Device]

Structures of light-emitting devices can be classified roughly into a single structure and a tandem structure. A light-emitting device having a single structure includes one light-emitting unit between a pair of electrodes. The light-emitting unit includes one or more light-emitting layers. To obtain white light emission with a single structure, two or more light-emitting layers are selected such that emission of the light-emitting layers can produce white color. For example, in the case of two colors, when emission colors of a first light-emitting layer and a second light-emitting layer are complementary colors, the light-emitting device can be configured to emit white light as a whole. To obtain white light emission by using three or more light-emitting layers, the light-emitting device is configured to emit white light as a whole by combining emission colors of the three or more light-emitting layers.

A light-emitting device having a tandem structure includes a plurality of light-emitting units between a pair of electrodes. Each light-emitting unit includes one or more light-emitting layers. When light-emitting layers that emit light of the same color are used in each light-emitting unit, luminance per predetermined current can be increased, and the light-emitting device can have higher reliability than that with a single structure. To obtain white light emission with a tandem structure, the light-emitting device is configured to obtain white light emission by combining light from light-emitting layers of a plurality of light-emitting units. Note that a combination of emission colors for obtaining white light emission is similar to that for a single structure. In the light-emitting device with a tandem structure, it is preferable that an intermediate layer such as a charge-generation layer be provided between the plurality of light-emitting units.

When the white light-emitting device and a light-emitting device with a SBS structure are compared to each other, the latter can have lower power consumption than the former. Meanwhile, the white light-emitting device is preferable in terms of lower manufacturing cost and higher manufacturing yield because the manufacturing process of the white light-emitting device is simpler than that of the light-emitting device with the SBS structure.

<Structure Example of Light-Emitting Device>

Figure 20A:
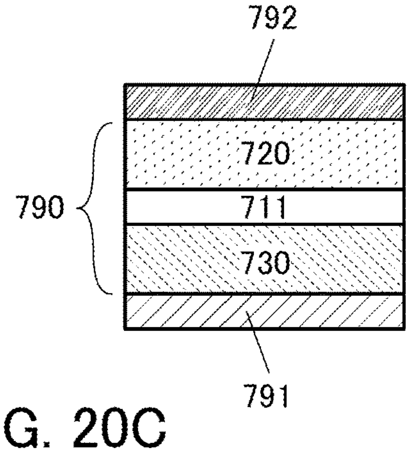
FIGS. 20A to 20F each illustrate a structure example of a light-emitting device.

As illustrated in FIG. 20A, the light-emitting device includes an EL layer 790 between a pair of electrodes (a lower electrode 791 and an upper electrode 792). The EL layer 790 can be formed of a plurality of layers such as a layer 720, a light-emitting layer 711, and a layer 730. The layer 720 can include, for example, a layer containing a substance with a high electron-injection property (an electron-injection layer) and a layer containing a substance with a high electron-transport property (an electron-transport layer). The light-emitting layer 711 contains a light-emitting compound, for example. The layer 730 can include, for example, a layer containing a substance with a high hole-injection property (a hole-injection layer) and a layer containing a substance with a high hole-transport property (a hole-transport layer).

The structure including the layer 720, the light-emitting layer 711, and the layer 730, which is provided between a pair of electrodes, can function as a single light-emitting unit, and the structure in FIG. 20A is referred to as a single structure in this specification.

Figure 20B:
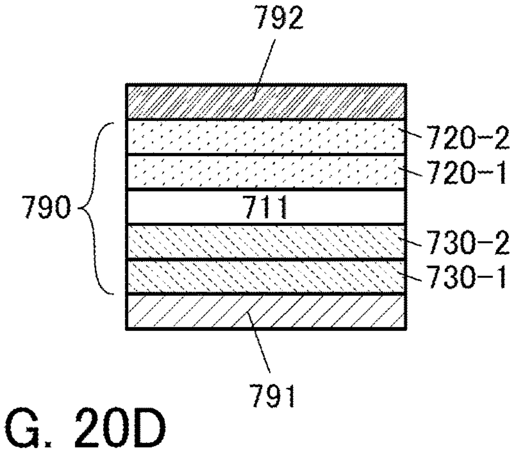

Specifically, the light-emitting device illustrated in FIG. 20B includes, over the lower electrode 791, a layer 730-1, a layer 730-2, the light-emitting layer 711, a layer 720-1, a layer 720-2, and the upper electrode 792. For example, when the lower electrode 791 functions as an anode and the upper electrode 792 functions as a cathode, the layer 730-1 functions as a hole-injection layer, the layer 730-2 functions as a hole-transport layer, the layer 720-1 functions as an electron-transport layer, and the layer 720-2 functions as an electron-injection layer. When the lower electrode 791 functions as a cathode and the upper electrode 792 functions as an anode, the layer 730-1 functions as an electron-injection layer, the layer 730-2 functions as an electron-transport layer, the layer 720-1 functions as a hole-transport layer, and the layer 720-2 functions as the hole-injection layer. With such a layered structure, carriers can be efficiently injected to the light-emitting layer 711, and the efficiency of the recombination of carriers in the light-emitting layer 711 can be enhanced.

Figure 20C:
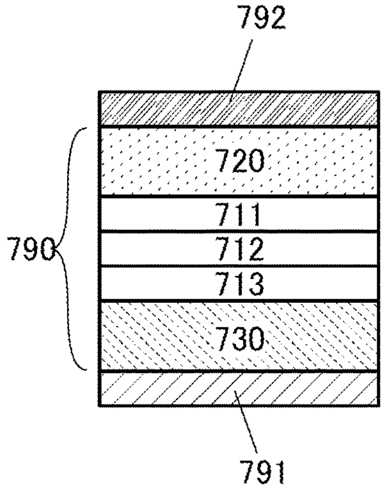
Figure 20D:
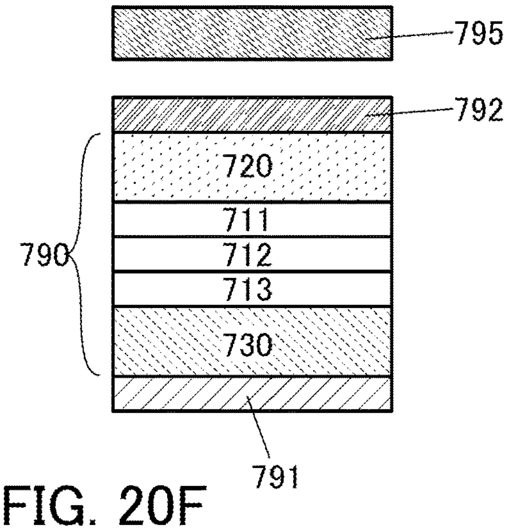

Note that structures in which a plurality of light-emitting layers (light-emitting layers 711, 712, and 713) are provided between the layer 720 and the layer 730 as illustrated in FIGS. 20C and 20D are other variations of the single structure.

Figure 20E:
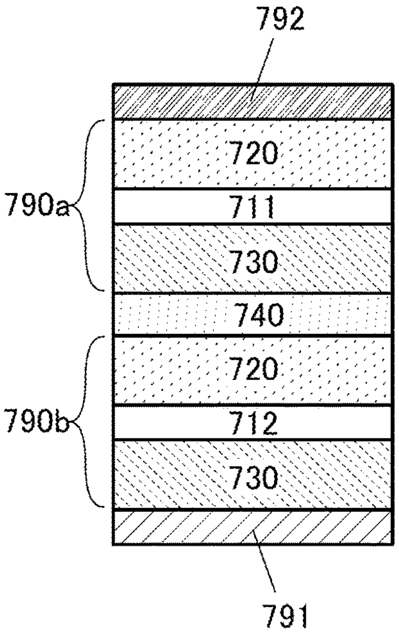
Figure 20F:
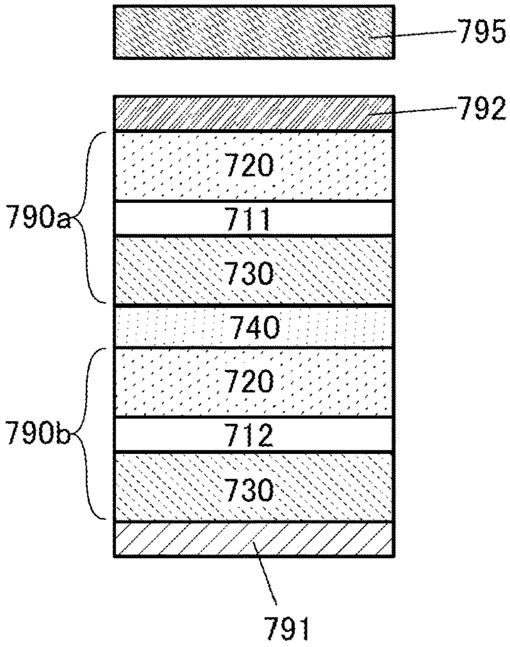

Structures in which a plurality of light-emitting units (EL layers 790*a* and 790*b*) are connected in series with an intermediate layer (charge-generation layer) 740 therebetween as illustrated in FIGS. 20E and 20F are referred to as a tandem structure in this specification. A tandem structure may be referred to as a stack structure. The tandem structure enables a light-emitting device capable of high luminance light emission.

In FIG. 20C, light-emitting materials that emit light of the same color, or moreover, the same light-emitting material may be used for the light-emitting layer 711, the light-emitting layer 712, and the light-emitting layer 713. The stacked light-emitting layers can increase emission luminance.

Alternatively, different light-emitting materials may be used for the light-emitting layer 711, the light-emitting layer 712, and the light-emitting layer 713. White light can be obtained when the light-emitting layer 711, the light-emitting layer 712, and the light-emitting layer 713 emit light of complementary colors. FIG. 20D shows an example in which a coloring layer 795 functioning as a color filter is provided. When white light passes through a color filter, light of a desired color can be obtained.

In FIG. 20E, light-emitting materials that emit light of the same color may be used for the light-emitting layer 711 and the light-emitting layer 712. Alternatively, light-emitting materials that emit light of different colors may be used for the light-emitting layer 711 and the light-emitting layer 712. White light can be obtained when the light-emitting layer 711 and the light-emitting layer 712 emit light of complementary colors. FIG. 20F shows an example in which the coloring layer 795 is further provided.

In FIGS. 20C to 20F, the layer 720 and the layer 730 may each have a layered structure of two or more layers as in FIG. 20B.

In FIG. 20D, light-emitting materials that emit light of the same color may be used for the light-emitting layer 711, the light-emitting layer 712, and the light-emitting layer 713. Similarly, in FIG. 20F, light-emitting materials that emit light of the same color may be used for the light-emitting layer 711 and the light-emitting layer 712. Here, when a color conversion layer is used instead of the coloring layer 795, light of a desired color different from the emission color of the light-emitting material can be obtained. For example, a blue light-emitting material is used for each light-emitting layer and blue light passes through the color conversion layer, whereby light with a wavelength longer than that of blue light (e.g., red light or green light) can be obtained. For the color conversion layer, a fluorescent material, a phosphorescent material, quantum dots, or the like can be used.

The emission color of the light-emitting device can be changed to red, green, blue, cyan, magenta, yellow, white, or the like depending on the material of the EL layer 790. When the light-emitting device has a microcavity structure, the color purity can be further increased.

The light-emitting device that emits white light may have a structure in which a light-emitting layer contains two or more kinds of light-emitting substances, or two or more light-emitting layers containing different light-emitting substances are stacked. In that case, the light-emitting substances are preferably selected such that the light-emitting substances emit light of complementary colors.

[Light-Emitting Device]

Here, a specific structure example of a light-emitting device will be described.

The light-emitting device includes at least a light-emitting layer. In addition to the light-emitting layer, the light-emitting device may further include a layer containing any of a substance with a high hole-injection property, a substance with a high hole-transport property, a hole-blocking material, a substance with a high electron-transport property, a substance with a high electron-blocking property, an electron-injection material, a substance with a bipolar property (a substance with a high electron- and hole-transport property), and the like.

Either a low molecular compound or a high molecular compound can be used in the light-emitting device, and an inorganic compound may also be included. Each layer included in the light-emitting device can be formed by any of the following methods: an evaporation method (including a vacuum evaporation method), a transfer method, a printing method, an inkjet method, a coating method, and the like.

For example, the light-emitting device can include one or more of a hole-injection layer, a hole-transport layer, a hole-blocking layer, an electron-blocking layer, an electron-transport layer, and an electron-injection layer in addition to the light-emitting layer.

The hole-injection layer injects holes from the anode to the hole-transport layer and contains a material with a high hole-injection property. Examples of a material with a high hole-injection property include an aromatic amine compound and a composite material containing a hole-transport material and an acceptor material (electron-accepting material).

The hole-transport layer transports holes injected from the anode by the hole-injection layer, to the light-emitting layer. The hole-transport layer contains a hole-transport material. The hole-transport material preferably has a hole mobility higher than or equal to $1\times10^{-6}$ $cm^2/Vs$. Note that other substances can also be used as long as the substances have a hole-transport property higher than an electron-transport property. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferred.

The electron-transport layer transports electrons injected from the cathode by the electron-injection layer, to the light-emitting layer. The electron-transport layer contains an electron-transport material. The electron-transport material preferably has an electron mobility higher than or equal to $1\times10^{-6}$ $cm^2/Vs$. Note that other substances can also be used as long as the substances have an electron-transport property higher than a hole-transport property. As the electron-transport material, any of the following materials having a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The electron-injection layer can be formed using an alkali metal, an alkaline earth metal, or a compound thereof, such as lithium, cesium, ytterbium, lithium fluoride (LiF), cesium fluoride (CsF), calcium fluoride ($CaF_2$), 8-(quinolinolato) lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate, for example. The electron-injection layer may have a stacked-layer structure of two or more layers. In the stacked-layer structure, for example, lithium fluoride can be used for the first layer and ytterbium can be used for the second layer.

Alternatively, the electron-injection layer may be formed using an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, or a pyridazine ring), and a triazine ring.

Note that the lowest unoccupied molecular orbital (LUMO) level of the organic compound having an unshared electron pair is preferably greater than or equal to −3.6 eV and less than or equal to −2.3 eV. In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2', 3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition point (Tg) than BPhen and thus has high heat resistance.

The light-emitting layer contains a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As one or more kinds of organic compounds, one or both of a hole-transport material and an electron-transport material can be used. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by exciplex—triplet energy transfer (ExTET), which is energy transfer from the exciplex to the light-emitting substance (phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in combination with any of the other embodiments described in this specification, as appropriate.

Embodiment 5

In this embodiment, electronic devices of one embodiment of the present invention will be described with reference to FIGS. 21A to 21D, FIGS. 22A to 22F, and FIGS. 23A to 23G.

Electronic devices in this embodiment are each provided with the display panel (display device) of one embodiment of the present invention in a display portion. The display panel of one embodiment of the present invention can be easily increased in resolution and definition and can achieve high display quality. Thus, the display panel of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and laptop personal computers, a monitor of a computer and the like, digital signage, and a large game machine such as a pachinko machine.

In particular, the display panel of one embodiment of the present invention can have a high resolution, and thus can be favorably used for an electronic device having a relatively small display portion. Examples of such an electronic device include watch-type and bracelet-type information terminal devices (wearable devices) and wearable devices worn on the head, such as a VR device like a head-mounted display, a glasses-type AR device, and an MR device.

The definition of the display panel of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. The pixel density (resolution) of the display panel of one embodiment of the present invention is preferably higher than or equal to 100 ppi, further preferably higher than or equal to 300 ppi, further preferably higher than or equal to 500 ppi, further preferably higher than or equal to 1000 ppi, further preferably higher than or equal to 2000 ppi, further preferably higher than or equal to 3000 ppi, still further preferably higher than or equal to 5000 ppi, and yet further preferably higher than or equal to 7000 ppi. The use of the display panel having one or both of such high definition and high resolution can further increase realistic sensation, sense of depth, and the like in personal use such as portable use and home use. There is no particular limitation on the screen ratio (aspect ratio) of the display panel of one embodiment of the present invention. For example, the display panel is compatible with a variety of screen ratios such as 1:1 (a square), 4:3, 16:9, and 16:10.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices are described with reference to FIGS. 21A to 21D. These wearable devices have one or both of a function of displaying AR contents and a function of displaying VR contents. Note that these wearable devices may have a function of displaying SR or MR contents, in addition to AR and VR contents. The electronic device having a function of displaying contents of at least one of AR, VR, SR, MR, and the like enables the user to feel a higher level of immersion.

Figure 21A:
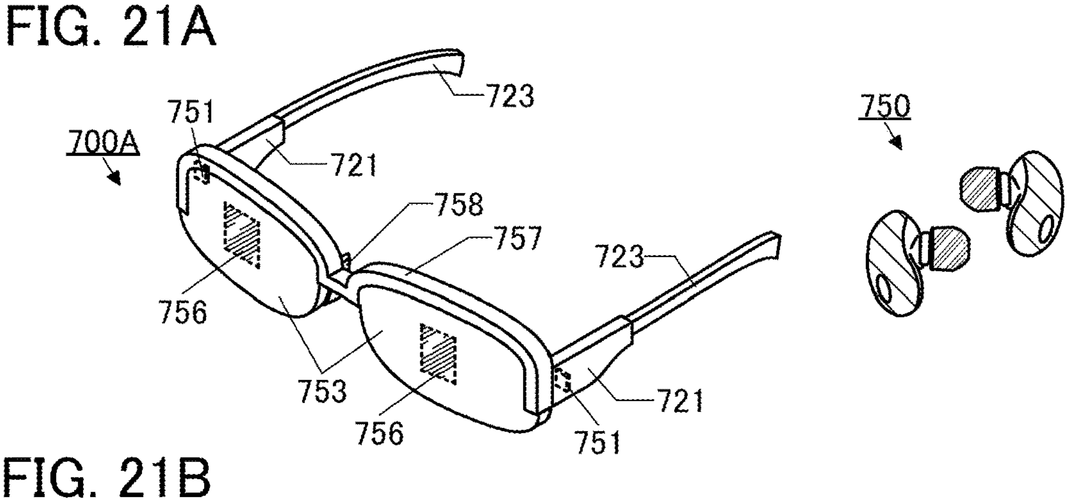
FIGS. 21A to 21D each illustrate a structure example of an electronic device.
Figure 21B:
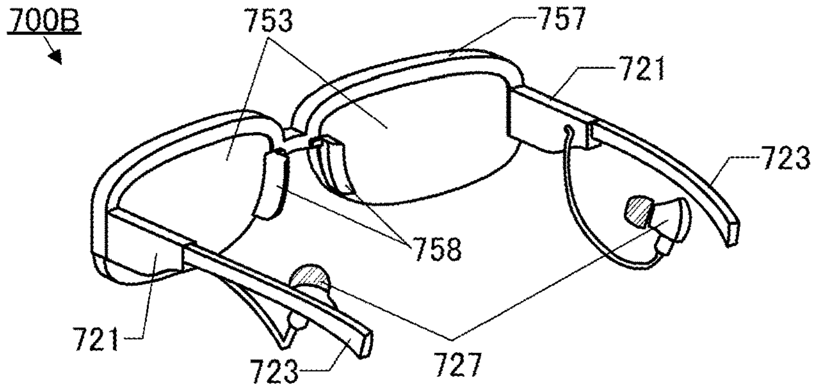

An electronic device 700A illustrated in FIG. 21A and an electronic device 700B illustrated in FIG. 21B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display panel of one embodiment of the present invention can be used in the display panels 751. Thus, the electronic devices are capable of performing ultrahigh-resolution display.

The electronic devices 700A and 700B can each project images displayed on the display panels 751 onto display regions 756 of the optical members 753. Since the optical members 753 have a light-transmitting property, the user can see images displayed on the display regions, which are superimposed on transmission images seen through the optical members 753. Accordingly, the electronic devices 700A and 700B are electronic devices capable of AR display.

In the electronic devices 700A and 700B, a camera capable of capturing images of the front side may be provided as the image capturing portion. Furthermore, when the electronic devices 700A and 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Instead of or in addition to the wireless communication device, a connector that can be connected to a cable for supplying a video signal and a power supply potential may be provided.

The electronic devices 700A and 700B are provided with a battery so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion device (also referred to as a photoelectric conversion element) can be used as a light-receiving device (also referred to as a light-receiving element). One or both of an inorganic semiconductor and an organic semiconductor can be used for an active layer of the photoelectric conversion device.

Figure 21C:
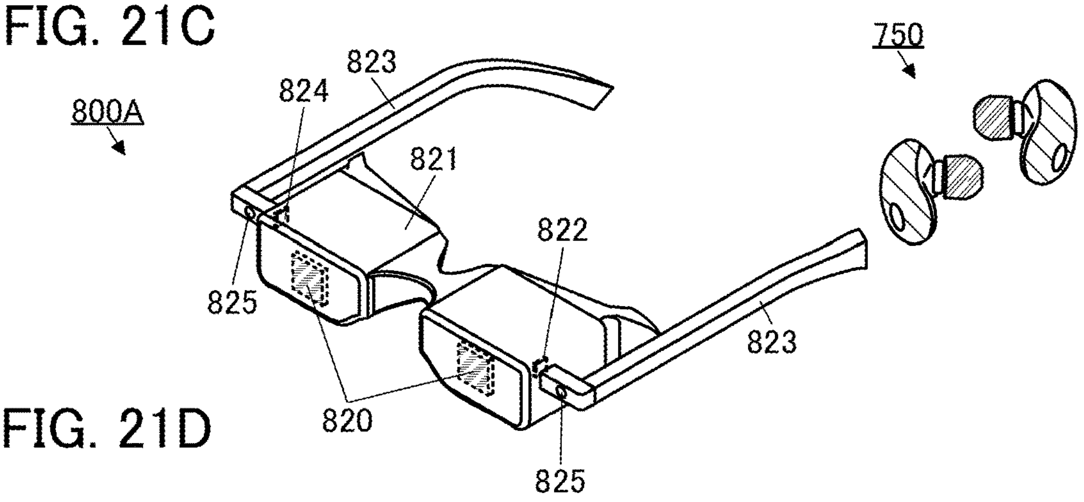
Figure 21D:
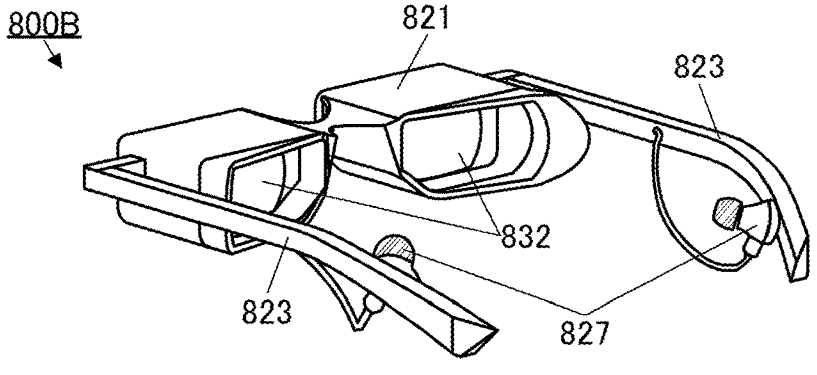

An electronic device 800A illustrated in FIG. 21C and an electronic device 800B illustrated in FIG. 21D each include a pair of display portions 820, a housing 821, a communication portion 822, a pair of wearing portions 823, a control portion 824, a pair of image capturing portions 825, and a pair of lenses 832.

The display panel of one embodiment of the present invention can be used in the display portions 820. Thus, the electronic devices are capable of performing ultrahigh-resolution display. Such electronic devices provide an enhanced sense of immersion to the user.

The display portions 820 are provided at positions where the user can see through the lenses 832 inside the housing 821. When the pair of display portions 820 display different images, three-dimensional display using parallax can be performed.

The electronic devices 800A and 800B can be regarded as electronic devices for VR. The user who wears the electronic device 800A or the electronic device 800B can see images displayed on the display portions 820 through the lenses 832.

The electronic devices 800A and 800B preferably include a mechanism for adjusting the lateral positions of the lenses 832 and the display portions 820 so that the lenses 832 and the display portions 820 are positioned optimally in accordance with the positions of the user's eyes. Moreover, the electronic devices 800A and 800B preferably include a mechanism for adjusting focus by changing the distance between the lenses 832 and the display portions 820.

The electronic device 800A or the electronic device 800B can be mounted on the user's head with the wearing portions 823. FIG. 21C and the like show examples where the wearing portion 823 has a shape like a temple (also referred to as a joint) of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example where the image capturing portions 825 are provided is shown here, a range sensor (hereinafter also referred to as a sensing portion) capable of measuring a distance between the user and an object just needs to be provided. In other words, the image capturing portion 825 is one embodiment of the sensing portion. As the sensing portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

The electronic device 800A may include a vibration mechanism that functions as bone-conduction earphones. For example, at least one of the display portion 820, the housing 821, and the wearing portion 823 can include the vibration mechanism. Thus, without additionally requiring an audio device such as headphones, earphones, or a speaker, the user can enjoy video and sound only by wearing the electronic device 800A.

The electronic devices 800A and 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones 750 include a communication portion (not illustrated) and has a wireless communication function. The earphones 750 can receive information (e.g., audio data) from the electronic device with the wireless communication function. For example, the electronic device 700A in FIG. 21A has a function of transmitting information to the earphones 750 with the wireless communication function. For another example, the electronic device 800A in FIG. 21C has a function of transmitting information to the earphones 750 with the wireless communication function.

The electronic device may include an earphone portion. The electronic device 700B in FIG. 21B includes earphone portions 727. For example, the earphone portion 727 can be connected to the control portion by wire. Part of a wiring that connects the earphone portion 727 and the control portion may be positioned inside the housing 721 or the wearing portion 723.

Similarly, the electronic device 800B in FIG. 21D includes earphone portions 827. For example, the earphone portion 827 can be connected to the control portion 824 by wire. Part of a wiring that connects the earphone portion 827 and the control portion 824 may be positioned inside the housing 821 or the wearing portion 823. Alternatively, the earphone portions 827 and the wearing portions 823 may include magnets. This is preferred because the earphone portions 827 can be fixed to the wearing portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic devices 700A and 700B) and the goggles-type device (e.g., the electronic devices 800A and 800B) are preferable as the electronic device of one embodiment of the present invention.

Figure 22A:
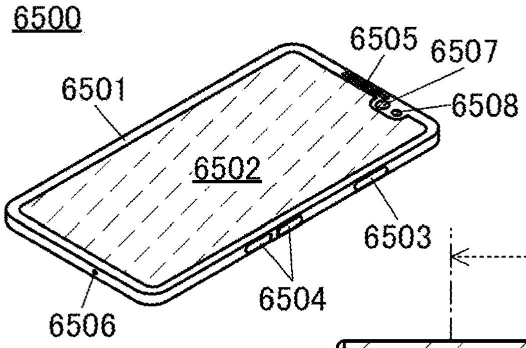
FIGS. 22A to 22F each illustrate a structure example of an electronic device.

An electronic device 6500 illustrated in FIG. 22A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display panel of one embodiment of the present invention can be used in the display portion 6502.

Figure 22B:
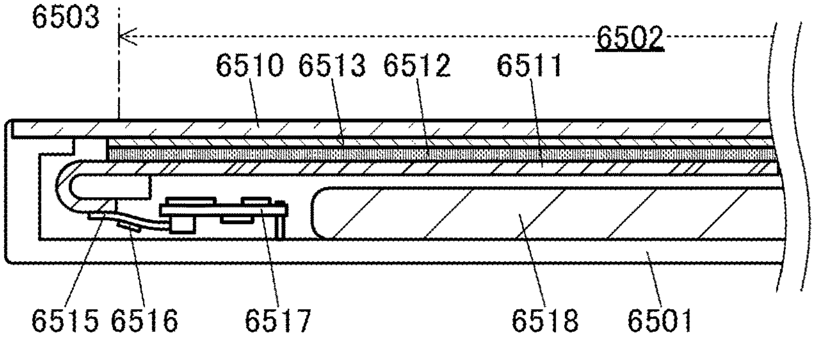

FIG. 22B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be achieved.

Figure 22C:
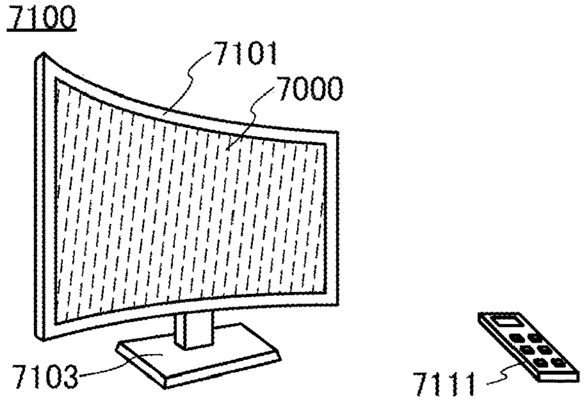

FIG. 22C illustrates an example of a television device. In a television device 7100, a display portion 7000 is incorporated in a housing 7101. Here, the housing 7101 is supported by a stand 7103.

Operation of the television device 7100 illustrated in FIG. 22C can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be controlled and videos displayed on the display portion 7000 can be controlled.

Note that the television device 7100 includes a receiver, a modem, and the like. A general television broadcast can be received with the receiver. When the television device is connected to a communication network with or without wires via the modem, one-way (from a transmitter to a receiver) or two-way (between a transmitter and a receiver or between receivers, for example) information communication can be performed.

Figure 22D:
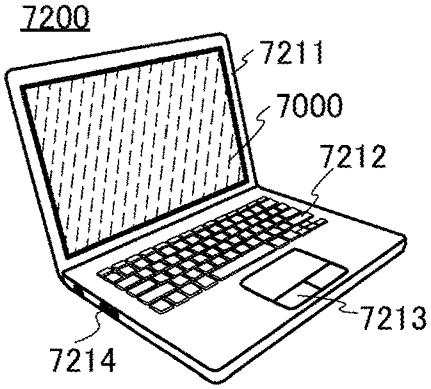

FIG. 22D illustrates an example of a laptop personal computer. The laptop personal computer 7200 includes a housing 7211, a keyboard 7212, a pointing device 7213, an external connection port 7214, and the like. The display portion 7000 is incorporated in the housing 7211.

Figure 22E:
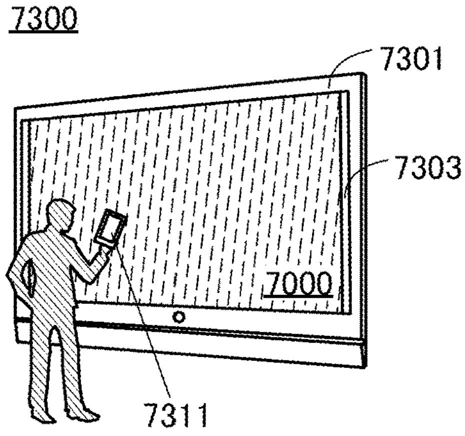
Figure 22F:
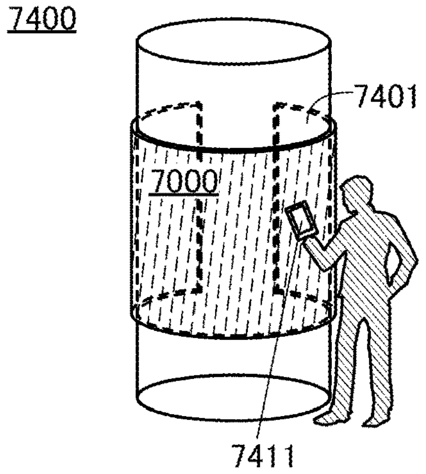

FIGS. 22E and 22F illustrate examples of digital signage.

Digital signage 7300 illustrated in FIG. 22E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 22F shows digital signage 7400 attached to a cylindrical pillar 7401. The digital signage 7400 includes the display portion 7000 provided along a curved surface of the pillar 7401.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIGS. 22E and 22F, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

The display panel of one embodiment of the present invention can be used in the display portion 7000 illustrated in each of FIGS. 22C to 22F.

Electronic devices illustrated in FIGS. 23A to 23G each include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, a smell, or infrared rays), a microphone 9008, and the like.

The electronic devices illustrated in FIGS. 23A to 23G have a variety of functions. For example, the electronic devices can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. Note that the functions of the electronic devices are not limited thereto, and the electronic devices can have a variety of functions. The electronic devices may include a plurality of display portions. The electronic devices may be provided with a camera or the like and have a function of capturing a still image or a moving image, a function of storing the captured image in a storage medium (an external storage medium or a storage medium incorporated in the camera), a function of displaying the captured image on the display portion, and the like.

The electronic devices illustrated in FIGS. 23A to 23G are be described in detail below.

Figure 23A:
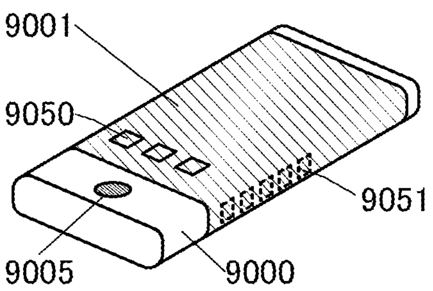
FIGS. 23A to 23G each illustrate a structure example of an electronic device.

FIG. 23A is a perspective view of a portable information terminal 9101. The portable information terminal 9101 can be used as a smartphone, for example. The portable information terminal 9101 may include the speaker 9003, the connection terminal 9006, the sensor 9007, or the like. The portable information terminal 9101 can display text and image information on its plurality of surfaces. FIG. 23A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 23B:
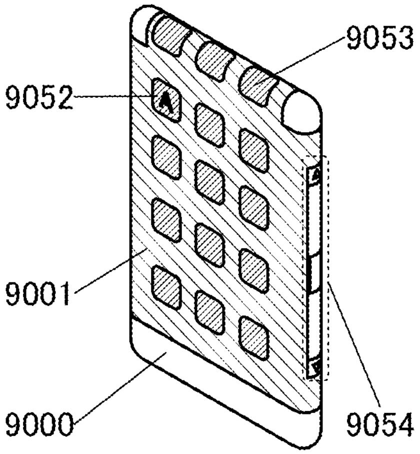

FIG. 23B is a perspective view of a portable information terminal 9102. The portable information terminal 9102 has a function of displaying information on three or more surfaces of the display portion 9001. Here, information 9052, information 9053, and information 9054 are displayed on different surfaces. For example, the user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

Figure 23C:
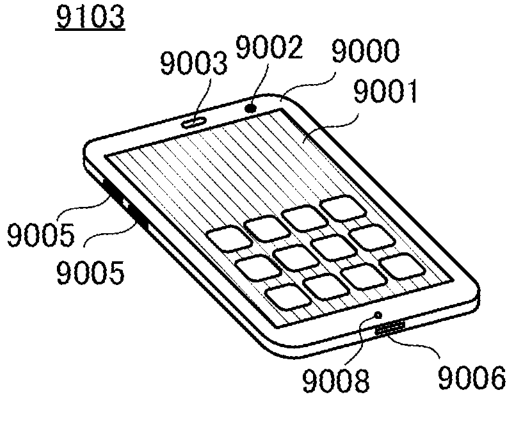

FIG. 23C is a perspective view of a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 23D:
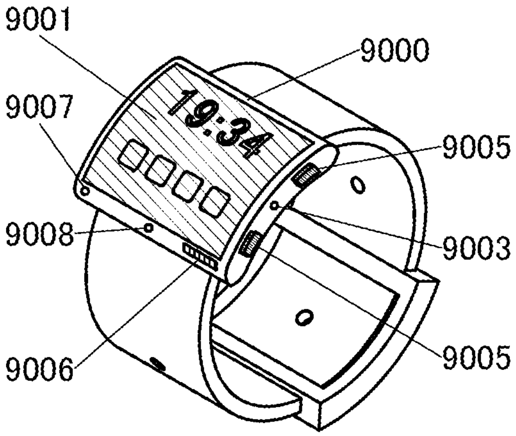

FIG. 23D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 23E:
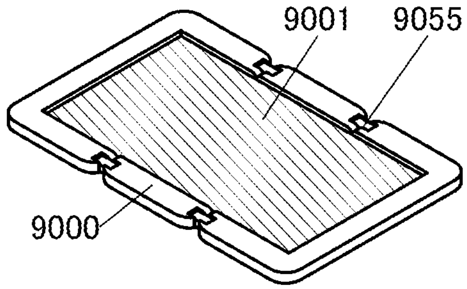
Figure 23F:
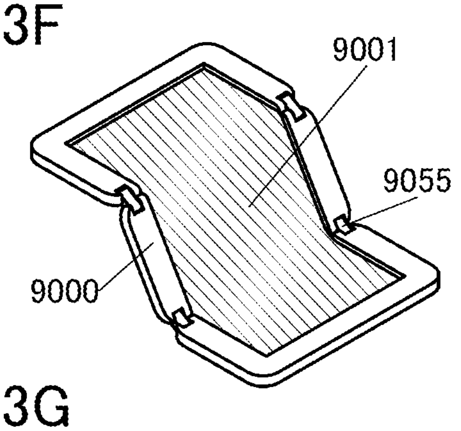
Figure 23G:
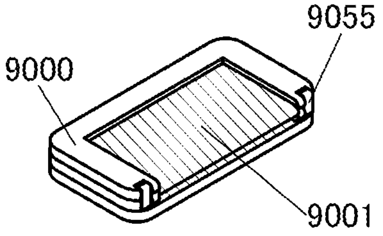

FIGS. 23E to 23G are perspective views of a foldable portable information terminal 9201. FIG. 23E is a perspective view showing the portable information terminal 9201 that is opened. FIG. 23G is a perspective view showing the portable information terminal 9201 that is folded. FIG. 23F is a perspective view showing the portable information terminal 9201 that is shifted from one of the states in FIGS. 23E and 23G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

At least part of this embodiment can be implemented in combination with any of the other embodiments described in this specification, as appropriate.

This application is based on Japanese Patent Application Serial No. 2021-113468 filed with Japan Patent Office on Jul. 8, 2021, the entire contents of which are hereby incorporated by reference.

What is claimed is:

1. A method of manufacturing a display device, comprising:

a first step of forming a first pixel electrode and a second pixel electrode which are apart from each other;

a second step of forming a first electroluminescent (EL) layer, a first layer, and a second layer over the first pixel electrode;

a third step of forming a second EL layer, a third layer, and a fourth layer over the second pixel electrode and then forming an insulating film covering the first layer, the second layer, the third layer, and the fourth layer;

a fourth step of forming a resin layer covering an end portion of the second layer and an end portion of the fourth layer by applying a photosensitive resin, exposing the photosensitive resin to light, and developing the photosensitive resin;

a fifth step of exposing a top surface of the first EL layer and a top surface of the second EL layer by etching parts of the first layer, the second layer, the third layer, and the fourth layer which are not covered with the resin layer; and a sixth step of forming a common electrode covering the first EL layer, the second EL layer, the insulating film, and the resin layer, wherein the light used for the fourth step contains ultraviolet light, wherein the second layer and the fourth layer contain a material which reflects or absorbs the light, and wherein the method further comprises the steps of etching parts or whole of portions of the insulating film, the second layer, and the fourth layer which are not covered with the resin layer after the third step, and recessing the resin layer by etching part of a surface of the resin layer after the fifth step.

2. The method of manufacturing a display device, according to claim 1, further comprising a step of changing the resin layer in shape by heat treatment between the fourth step and the fifth step.

3. The method of manufacturing a display device, according to claim 2, further comprising a step of emitting second light containing ultraviolet light between the fourth step and the step of changing the resin layer in shape by heat treatment.

4. The method of manufacturing a display device, according to claim 1, wherein part of the insulating film which is not covered with the resin layer is removed in the fifth step.

5. The method of manufacturing a display device, according to claim 1, wherein each of the second layer and the fourth layer contains silicon.

6. The method of manufacturing a display device, according to claim 1, wherein each of the second layer and the fourth layer contains at least one of titanium, chromium, tantalum, carbon, and germanium.

7. The method of manufacturing a display device, according to claim 1, wherein each of the first layer and the third layer contains an element different from an element contained in the second layer and the fourth layer, and wherein each of the first layer and the third layer contains aluminum oxide.

8. The method of manufacturing a display device, according to claim 1, wherein in the fifth step, parts or the whole of the first layer and the third layer are etched by a wet etching method to expose a top surface of the first EL layer and a top surface of the second EL layer.

* * * * *